(12) United States Patent  
Funaya et al.

(10) Patent No.: US 6,313,533 B1
(45) Date of Patent: Nov. 6, 2001

(54) FUNCTION ELEMENT, SUBSTRATE FOR MOUNTING FUNCTION ELEMENT THEREON, AND METHOD OF CONNECTING THEM TO EACH OTHER

(75) Inventors: Takuo Funaya; Kouji Matsui; Naoji Senba, all of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/346,949

(22) Filed: Jul. 1, 1999

(30) Foreign Application Priority Data

Jul. 1, 1998 (JP) .................................................. 10-186299
Jun. 30, 1999 (JP) .................................................. 11-185230

(51) Int. Cl.[7] .......................... H01L 23/48; H01L 23/52; H01L 29/40
(52) U.S. Cl. .......................... 257/737; 257/738; 257/778
(58) Field of Search .................................... 257/778, 737, 257/738

(56) References Cited

U.S. PATENT DOCUMENTS

| 5,629,566 | * | 5/1997 | Doi et al. . |
| 5,900,581 | * | 5/1999 | Ootake . |
| 5,959,363 | * | 9/1999 | Yamada et al. . |
| 6,137,170 | * | 10/2000 | Ujiie et al. . |

FOREIGN PATENT DOCUMENTS

| 5-36761 | 2/1993 | (JP) . |
| 6-21149 | 1/1994 | (JP) . |
| 7-231113 | 8/1995 | (JP) . |
| 2503735 | 4/1996 | (JP) . |
| 2655496 | 5/1997 | (JP) . |
| 2660943 | 6/1997 | (JP) . |
| 2661382 | 6/1997 | (JP) . |
| 9-252027 | 9/1997 | (JP) . |
| 10-326798 | 12/1998 | (JP) . |
| 10-335373 | 12/1998 | (JP) . |
| 11-67830 | 3/1999 | (JP) . |

* cited by examiner

Primary Examiner—David E. Graybill
(74) Attorney, Agent, or Firm—Young & Thompson

(57) ABSTRACT

There is provided a function element including a resin layer formed on a surface thereof, the resin layer having adhesive property and sealing property, the resin layer having such a pattern that a resin layer does not exist in at least one of following areas: (a) a first area around an area where device performances are influenced by resin of which the resin layer was composed, (b) a second area around pads or bumps, (c) a third area around an area on which a wiring of a substrate will exist when the function element is coupled to the substrate, and (d) a fourth area around an area on which a passive element mounted on a substrate will exist when the function element is coupled to the substrate. The function element prevents extra resin from adhering to an area of the function element where device performances will be influenced by the resin, when the function element is coupled to a substrate with a resin layer being sandwiched therebetween.

19 Claims, 11 Drawing Sheets

FUNCTION ELEMENT, SUBSTRATE FOR MOUNTING FUNCTION ELEMENT THEREON, AND METHOD OF CONNECTING THEM TO EACH OTHER

BACKGROUND OF THE INVENTION

1. Field of the Invention

The invention relates to a function element for making a flip-flop connection, a substrate on which such a function element is to be mounted, a method of fabricating a function element, a method of fabricating a substrate on which such a function element is to be mounted, a coupling structure of a function element and a substrate, and a method of coupling a function element to a substrate.

2. Description of the Related Art

There have been suggested various methods of coupling a function element to a substrate, for instance, in Japanese Patent No. 2503735, Japanese Patent No. 2661382, Japanese Unexamined Patent Publication No. 5-36761, Japanese Unexamined Patent Publication No. 6-21149, Japanese Patent No. 2660943, Japanese Patent No. 2655496, Japanese Unexamined Patent Publication No. 9-252027, and Japanese Unexamined Patent Publication No. 7-231113 (Japanese Patent No. 2874570).

FIGS. 1A and 1B illustrate one of conventional methods of coupling a function element to a substrate with a resin layer having photosensitivity and thermosetting property, being sandwiched therebetween. FIG. 1A is a plan view illustrating a pattern of resin formed on a function element, and FIG. 1B is a cross-sectional view taken along the line IB—IB in FIG. 1A.

In a conventional method, a function element 1 (or a substrate) is first formed at a surface thereof with bumps 5 (or electrode pads in the case of a substrate), as illustrated in FIG. 1A. Then, resin 6 is coated onto the surface of the function element 1. The resin 6 is exposed to a light and then developed to thereby remove portions of the resin 6 existing above the bumps 5, as illustrated in FIG. 1B.

Japanese Unexamined Patent Publication No. 11-67830 has suggested a method of coupling a SAW element to a circuit board with a sealing resin layer being sandwiched therebetween. The sealing resin layer is composed of resin having photosensitivity and thermosetting property. First, the resin is coated onto an active surface of SAW element. Then, portions of resin on pads, bumps, and a vibration transferring section (IDT electrode) are removed by exposure to a light and development. However, a portion of resin is not removed in an area with which an electrode wiring of a circuit board will make contact, when the SAW element is coupled to the circuit board.

Japanese Unexamined Patent Publication No. 10-326798 has suggested a method of coupling a function element to a circuit board with a sealing resin layer being sandwiched therebetween. The sealing resin layer is composed of resin having photosensitivity and thermosetting property. First, the resin is coated onto both an active surface of the function element and a surface of the circuit board. Then, unnecessary portions of the resin are removed by exposure of the resin to a light and development of the resin. Thus, the resin layer is patterned. However, a portion of resin is not removed in an area with which an electrode wiring of the circuit board will make contact and in an area with which passive elements mounted on the circuit board, such as L, C and R, will make contact, when the function element is coupled to the circuit board.

In the above-mentioned methods, it is not unavoidable that a gap which has a width equal to a sum of a height of a wiring layer 9 formed on the circuit board 10 and a height of the bump 5 formed on the function element 1 is generated between the circuit board 10 and the function element 1 after coupling them to each other. Hence, a resin layer 6 which has a thickness enough to fill the gap therewith and which has photosensitivity and thermosetting property has to be coated on either the function element 1 and the circuit board 10.

In addition, if the resin layer 6 is collapsed by a width equal to a thickness of the wiring layer 9 formed on the circuit board 10, the resin layer 6 would make contact only with the wiring layer 9, and would not make contact with the circuit board 10. Accordingly, it was necessary to apply big pressure to the function element 1 and the circuit board 10 for thermocompression bonding of them.

If a passive element 15 such as L, C and R is mounted on the circuit board 10, as illustrated in FIG. 2, it was necessary to apply a bigger pressure to the function element 1 and the circuit board 10 in order to collapse the resin layer 6 by a width equal to a height of the passive element 15.

In the methods suggested in Japanese Unexamined Patent Publications Nos. 11-67830 and 10-326798, since a space is produced between a function element and a circuit board after coupling of them to each other, a patterned resin layer formed on either the function element and the circuit board is designed to fill the space therewith. However, when the function element and the circuit board are coupled to each other, extra resin was frequently adhered to the function element and/or the circuit board in an area where device performances of the function element or the circuit board are harmfully influenced by resin of which the resin layer 6 is composed.

FIGS. 4A and 4B illustrate another conventional method of coupling a function element to a circuit board with resin having photosensitivity and thermosetting property, being sandwiched therebetween.

In this method, as illustrated in FIG. 4A, an adhesive resin layer 6 is formed on a function element 1 in such a pattern that the resin layer 6 is selectively removed around bumps 5 formed on electrode pads 3. Thereafter, as illustrated in FIG. 4B, the function element 1 is thermally compressed onto a circuit board 8 to thereby bond insulating portions of the function element 1 and the circuit board 8 through the resin layer 6, and at the same time, electrically conductive portions of the function element 1 and the circuit board 8 through the bumps 5 and electrodes 9 formed on the circuit board 8.

Japanese Unexamined Patent Publication No. 10-335373 has suggested a method of coupling a semiconductor device to a circuit board.

First, as illustrated in FIG. 5A, electrodes 9 formed on a circuit board 8 are coated with adhesive resin 14. Then, as illustrated in FIG. 5B, a function element 1 and the circuit board 8 are heated, and are coupled to each other in thermal compression. With bumps 5 formed on electrode pads 3 formed at a surface of the function element 1, being kept in contact with the electrodes 9 formed on the circuit board 8, ultrasonic wave is applied to the adhesive resin 14 to thereby cure the adhesive resin 14.

The above-mentioned conventional methods of coupling a function element to a circuit board with resin being sandwiched therebetween are accompanied with following problems.

The first problem is as follows. When, sealing resin having photosensitivity and thermosetting property is coated on an active surface of a function element, and then portions of the resin are selectively removed only on pads and bumps by exposure of the resin to a light and development of the resin, the resin 6 would not make contact with the circuit board 10, if the resin 6 is not collapsed by a thickness equal to a thickness of the wiring layer 9 formed on the circuit board 10, or by a thickness equal to a height of the passive element 15.

In a method of coupling the function element 1 to the circuit board 10, if resin having much fluidity is selected, such resin might penetrate an area in which the resin 6 is not allowed to exist. Hence, resin having small fluidity is usually selected. As a result, unless a big pressure is applied to the function element 1 and the circuit board 10, such resin having small fluidity would not be collapsed.

When the function element 1 is to be coupled to the circuit board 10 by thermal compression with such resin being sandwiched therebetween, unless the resin 6 is collapsed, or the wiring layer 9 or the passive element 15 is collapsed, the resin 6 would not make contact with the circuit board 10. As a result, a big pressure has to be applied for thermal compression.

Such a big pressure might cause structural breakage or defect in the function element 1, the bumps 5, the circuit board 10 or the passive element 15. Such structural breakage or defect would cause an increase in resistivity of a resultant device and connection with no long-term reliability.

If the function element 1 is coupled to the circuit board 10 in such a pressure that the above-mentioned structural breakage or defect is not caused, the resin 6 often would not make contact with the circuit board 10. In such a case, as illustrated in FIG. 2, bubbles or gap 12 are generated in the resin 6, which does not ensure reliable connection between the function element 1 and the circuit board 10.

The second problem is that when the sealing resin 6 having photosensitivity and thermosetting property is coated onto a surface of the circuit board 10, a greater height of the wiring layer 9 formed on the circuit board 10 would cause greater probability that the resin layer 6 would have irregularities on a surface thereof. The passive element 15 mounted on the circuit board 10 would cause generation of irregularities on a surface of the resin layer 6.

The reason is as follows. In areas where the high wiring layer 9 exists or the passive element 15 is mounted, a surface of the resin layer 6 would be likely to be protruded, after coating the resin layer 6 on the function element 1, with the result of irregularities on a surface of the resin layer 6. If the resin layer 6 had a non-uniform thickness because of such irregularities, protrusion of the resin layer 6 would make first contact with an active surface of the function element 1, when the function element 1 is coupled to the circuit board 10. Hence, if the function element 1 is coupled to the circuit board 10 in a small pressure, the resin layer 6 would make contact at its entire surface with an active surface of the function element 1, resulting in that the bubbles or gap 12 is involved in the resin layer 6.

It would be necessary to apply a bigger pressure to the function element 1 and the circuit board 10 to make the resin layer 6 contact in its entire surface with the function element 1, resulting in that structural breakage or defect might be caused in the function element 1, the bumps 5, the circuit board 10, or the passive element 15.

On the other hand, if sealing resin having high viscosity is used to thereby thicken the resin layer 6 for uniformizing a thickness of the resin layer 6, the resin layer 6 would readily involve bubbles therein, when the resin layer 6 is coated onto the function element 6 by spin coating, curtain coating or printing.

In addition, since photosensitive resin has an aspect ratio inherent thereto, if sealing resin is coated in a greater thickness, limitation in a minimum size in a pattern would be smaller than the same in a pattern composed of sealing resin coated in a smaller thickness.

The third problem is as follows. When bumps such as a plated bump, a ball bump and a stud bump are formed on electrode pads formed at a surface of a function element, sealing resin having photosensitivity and thermosetting property, ad having small fluidity is coated on an active surface of the function element, and sealing resin is selectively removed around the electrode pads and the bumps, if an adhesion type exposure device is used for exposing the resin to a light, the bumps 5 are collapsed at summits thereof by a photomask 7, as illustrated in FIG. 3B.

The reason is as follows. It is now supposed that sealing resin having photosensitivity, thermosetting property and small fluidity is connected to a print circuit board on which a copper foil having a thickness of 20 $\mu$m has been already formed as an electrode wiring. In this example, if the sealing resin is not collapsed by a length equal to a thickness of the electrode wiring, the sealing resin would not make contact with the circuit board. Hence, it would be necessary to apply a big pressure to the sealing resin and the circuit board for coupling them to each other. However, such a big pressure would cause structural defect in the sealing resin and/or the circuit board, or cause the gap 12 in the sealing resin 6, which does not ensure desired connection between the sealing resin and the circuit board.

If a step between a surface of the circuit board and a wiring layer is made smaller by designing the wiring layer to have a smaller thickness, or if solder resist is formed on a surface of the circuit board to thereby apparently reduce a thickness of the wiring layer, as illustrated in FIG. 3A, the bumps 5 would be necessary to be designed to have a height equal to or greater than a thickness of the resin layer 6 in order for summits of the bumps 5 formed on the electrode pads 3 to make contact with the electrode pads formed on the circuit board.

As a result, as illustrated in FIG. 3B, if an adhesion type exposure device is used for exposing the resin layer 6 to a light, the photomask 7 would collapse the summits 11 of the bumps 5 when the photomask 7 makes close contact with the resin layer 6. If the summits 11 of the bumps 5 are collapsed, a height of the bumps 5 would be reduced before the circuit board 1 is covered with the resin layer 6. Hence, even if the resin layer 6 reaches the a surface of the circuit board 1, the bumps 5 could not make contact with the electrode pads 3.

The fourth problem is as follows. In the conventional methods of coupling a function element to a circuit board by thermal compression, when a function element is coupled to a circuit board with sealing resin having photosensitivity and thermosetting property being sandwiched therebetween, after the sealing resin is selectively removed in areas around an area with which an area of a function element which will be influenced by the sealing resin as to device performances, makes contact, and around bumps and pads, extra resin might be adhered to a portion of a passive element or a function element which portion would be harmfully influenced by the sealing resin.

The reason is that even if the sealing resin is selectively removed in the above-mentioned areas by exposure of the sealing resin to a light and development of the sealing resin, organic gas produced by temperature increase in thermal compression is cooled, and thus, resin is aggregated and adhered to the above-mentioned areas.

The conventional methods of coupling a function element to a circuit board as illustrated in FIGS. 4A, 4B, 5A and 5B are accompanied with the following problems.

The first problem is that it would take much time to electrically connect electrical conductors, specifically bumps and electrode pads, to each other in thermal compression.

The reason is as follows. Taking heat-resistance of a semiconductor device and a circuit board into consideration, it would be impossible to carry out thermal compression at a temperature of 400 degrees centigrade or greater. When bumps are composed of refractory metal such as gold, metal atoms are thermally diffused and coupled to each other unlike a case where bumps are composed of metals having a low melting point, such as solder and indium. Hence, it is necessary to apply heat to the resin layer for 20 seconds or longer.

The second problem is that though electrical conductors and insulating portions are simultaneously connected to each other, respectively, between a function element and a circuit board in the conventional method illustrated in FIGS. 4A and 4B, it would be quite difficult to simultaneously satisfy a condition for connecting metal bumps to pads and a condition for adhering sealing resin to a circuit board.

The reason is as follows. In the method, heat and pressure are applied to both the bumps and the sealing resin. Hence, when the bumps are composed of refractory metal, it is preferable that thermal compression is carried out at a high temperature. However, resin will be carbonized at a temperature equal to or greater than a glass transition temperature. Hence, it would be almost impossible to simultaneously satisfy an optimal condition for connection of bumps to pads and an optimal condition for connecting the resin to a circuit board.

The third problem is that a load might damage a function element and/or a circuit board in the method illustrated in FIGS. 4A and 4B where electrical conductors and insulating portions are simultaneously connected to each other, respectively, between a function element and a circuit board.

The reason is that the greater number of the bumps needs a greater area of the sealing resin, and hence, would make it necessary to apply a greater load to the sealing resin in thermal compression between the function element and the circuit board.

In addition, when the sealing resin has high elasticity, it would be necessary to apply a high load to the sealing resin in order to cause the sealing resin to make close contact with the function element and the circuit board, because of irregularities existing on a surface of the sealing resin.

The fourth problem is that it is difficult to extract electrical conductors out of a device which has not passed a quality test, and couple again a function element to a circuit board.

When the bumps are composed of refractory metal, a temperature at which a function element is coupled to a circuit board is almost equal to or greater than a curing point of the sealing resin having photosensitivity and thermosetting property. Since the sealing resin is thermosetting one, the sealing resin will be cured during thermal compression. It is difficult to melt cured resin with solution. Hence, it is almost impossible to separate a function element and a circuit board from each other without breaking them.

The fifth problem is that sealing resin having fluidity and low elasticity will flow into electrical conductors and an area of a function element harmfully influenced by the resin, when compressed, in thermal compression in the method illustrated in FIGS. 4A and 4B where electrical conductors and insulating portions are simultaneously connected to each other, respectively, between a function element and a circuit board.

The reason is as follows. In the method as illustrated in FIGS. 4A and 4B where electrical conductors and insulating portions are simultaneously connected to each other, respectively, it is necessary to apply a greater pressure across a function element and a circuit board than a pressure with which only the resin layer is connected to a circuit board, because the electrodes have to be connected to each other through the bumps. Hence, the sealing resin is further pressurized after the insulating portions are connected to each other, the sealing resin might flow through a gap existing between a function element and a circuit board, and penetrate electrical conductors or an area of a function element harmfully influenced by the resin.

The sixth problem is that the adhesive resin might be involved between the bumps 5 and the electrodes 9 in the method illustrated in FIGS. 5A and 5B.

In addition, while the resin is being heated, bubbles are generated out of the adhesive resin in a gap between the function element 1 and the circuit board 8. As a result, the adhesive resin might flow and thereby adhere to a surface of a head of a tool which absorbs the function element 1 thereto.

Furthermore, when the bumps 5 are connected to the electrodes 9 by ultrasonic waves, it is quite difficult to uniformly apply ultrasonic wave oscillation to the bumps 5 due to the adhesive resin 14 existing around the bumps 5.

The reason is as follows. If the bumps 5 are to be connected to the electrodes 9 at a low pressure in the method illustrated in FIGS. 5A and 5B, it is preferable that the adhesive resin 14 has fluidity at room temperature. However, the adhesive resin 14 existing just below the bumps 5 might be residual between the electrodes 9 and the bumps 5. If the adhesive resin 14 is residual between the bumps 5 and the electrodes 9, a resistance between them would be much increased.

Furthermore, since the adhesive resin 14 is heated while the function element 1 is connected to the circuit board 8, solvent is volatilized, and hence, bubbles are generated out of the adhesive resin 14. As a result, after the adhesive resin 14 has been cured, the adhesive resin 14 is residual in a gap between the function element 1 and the circuit board 8.

In addition, since the adhesive resin 14 flows outwardly of a gap between the function element 1 and the circuit board 8 when they are compressed to each other, the adhesive resin 14 might be adhered to a tool head of a mounter. Hence, it is necessary to carry out an additional step of cleaning the tool head.

In a method of coupling a function element to a circuit board, it would be difficult to uniformly apply ultrasonic wave to the bumps, due to the bubbles and the resin residual below the bumps.

It should be noted that the specification refers to Japanese Unexamined Patent Publications Nos. 11-67830, 10-326798 and 10-335373, but these Publications do not constitute any prior art in 35 U.S.C. §102 and §103. The reference to those Publications does not mean that the applicant admits them as prior art. Those Publications are mentioned in this specification only for assisting readers to better understand the present invention.

SUMMARY OF THE INVENTION

In view of the above-mentioned problems in the prior art, it is an object of the present invention to provide a function element and a substrate on which a function element is to be mounted both of which are capable of ensuring no defects in a resin layer and electrical conductors, making reliable flip-flop connection, and carrying out simultaneous connection in insulating sections and electrically conductive sections.

It is also an object of the present invention to provide a method of coupling a function element to a substrate which method is capable of preventing extra resin from adhering to a passive element, and an area of a function element harmfully influenced by the resin, and simultaneously carrying out connection in insulating sections and electrically conductive sections.

Another object of the present invention is to provide a method of coupling a function element to a substrate which method is capable of shortening a period of time necessary for coupling, preventing a function element and a substrate being damaged when they are being coupled, and preventing sealing resin from being carbonized.

In one aspect of the present invention, there is provided a function element including a resin layer formed on a surface thereof, the resin layer having adhesive property and sealing property, the resin layer having such a pattern that a resin layer does not exist in at least one of following areas: (a) a first area around an area where device performances are influenced by resin of which the resin layer was composed, (b) a second area around pads or bumps, (c) a third area around an area on which a wiring of a substrate will exist when the function element is coupled to the substrate, and (d) a fourth area around an area on which a passive element mounted on a substrate will exist when the function element is coupled to the substrate.

The function element may be designed to include at least one electrode pad, and a bump formed on the electrode pad.

It is preferable that the resin layer is composed of resin having photosensitivity and thermosetting property.

It is preferable that the resin layer has a function for flip-chip connection and a function of acting as a passivation film.

In another aspect of the present invention, there is provided a method of fabricating a function element, including the steps of (a) forming a resin layer on an active plane of a function element, the resin layer being composed of resin having photosensitivity and thermosetting property, and (b) pattering the resin layer in such a pattern that a resin layer does not exist in both (b1) a first area around pads or bumps, and at least one of following areas (b2) to (b4), (b2) a second area around an area on which a wiring of a substrate will exist when the function element is coupled to the substrate, (b3) a third area around an area on which a passive element mounted on a substrate will exist when the function element is coupled to the substrate, and (b4) a fourth area around an area with which an area of the function element where device performances of the function element are influenced by resin of which the resin layer was composed, makes contact.

There is further provided a method of fabricating a function element, including the steps of (a) forming a bump on an electrode pad of a function element, (b) forming a resin layer on an active plane of the function element, the resin layer being composed of resin having photosensitivity and thermosetting property, and (c) pattering the resin layer in such a pattern that a resin layer does not exist in both (c1) a first area around pads or bumps, and at least one of following areas (c2) to (c4), (c2) a second area around an area on which a wiring of a substrate will exist when the function element is coupled to the substrate, (c3) a third area around an area on which a passive element mounted on a substrate will exist when the function element is coupled to the substrate, and (c4) a fourth area around an area with which an area of the function element where device performances of the function element are influenced by resin of which the resin layer was composed, makes contact.

There is still further provided a method of fabricating a function element, including the steps of (a) forming a resin layer on an active plane of a function element, the resin layer being composed of resin having photosensitivity and thermosetting property, a passivation film being not formed on the active plane, (b) pattering the resin layer in such a pattern that a resin layer does not exist in both (b1) a first area around pads or bumps, and at least one of following areas (b2) to (b4): (b2) a second area around an area on which a wiring of a substrate will exist when the function element is coupled to the substrate, (b3) a third area around an area on which a passive element mounted on a substrate will exist when the function element is coupled to the substrate, and (b4) a fourth area around an area with which an area of the function element where device performances of the function element are influenced by resin of which the resin layer was composed, makes contact.

There is yet further provided a method of fabricating a function element, including the steps of (a) forming a bump on an electrode pad of a function element including no passivation film formed thereon, (b) forming a resin layer on an active plane of the function element, the resin layer being composed of resin having photosensitivity and thermosetting property, and (c) pattering the resin layer in such a pattern that a resin layer does not exist in both (c1) a first area around pads or bumps, and at least one of following areas (c2) to (c4): (c2) a second area around an area on which a wiring of a substrate will exist when the function element is coupled to the substrate, (c3) a third area around an area on which a passive element mounted on a substrate will exist when the function element is coupled to the substrate, and (c4) a fourth area around an area with which an area of the function element where device performances of the function element are influenced by resin of which the resin layer was composed, makes contact.

In still another aspect of the present invention, there is provided a substrate on which a function element is to be mounted and which includes a resin layer formed on a surface thereof, the resin layer having adhesive property and sealing property, the resin layer having such a pattern that a resin layer does not exist in both (a) a first area around pads or bumps, and at least one of following areas (b) to (d): (b) a second area around an area in which a wiring is formed, (c) a third area around an area on which a passive element is mounted, and (d) a fourth area around an area with which an area of the function element where device performances of the function element are influenced by resin of which the resin layer was composed, makes contact.

There is further provided a substrate on which a function element is to be mounted and which includes a resin layer formed on a surface thereof, the resin layer having adhesive property and sealing property, the substrate being formed at a surface thereof with at least one recess, the resin layer is formed in the recess.

It is preferable that the substrate includes at least one electrode pad, and a bump formed on the electrode pad.

It is preferable that the resin layer is composed of resin having photosensitivity and thermosetting property.

In yet another aspect of the present invention, there is provided a combination of a function element and a substrate on which the function element is to be mounted, the function element including a patterned resin layer formed on a surface thereof, the patterned resin layer having adhesive property and sealing property, the substrate being formed with a recess in an area with which the resin layer makes contact, when the function element is coupled to the substrate.

In still yet another aspect of the present invention, there is provided a method of fabricating a substrate on which a function element is to be mounted, including the steps of (a) forming a resin layer on a surface of a substrate, the resin layer being composed of resin having photosensitivity and thermosetting property, and (b) patterning the resin layer in such a pattern that a resin layer does not exist in both (b1) a first area around pads or bumps, and at least one of following areas (b2) to (b4): (b2) a second area around an area in which a wiring is formed, (b3) a third area around an area on which a passive element is mounted, and (b4) a fourth area around an area with which an area of the function element where device performances of the function element are influenced by resin of which the resin layer was composed, makes contact.

There is further provided a method of fabricating a substrate on which a function element is to be mounted, including the steps of (a) forming a bump on an electrode pad of a substrate, (b) forming a resin layer on a surface of the substrate, the resin layer being composed of resin having photosensitivity and thermosetting property, and (c) patterning the resin layer in such a pattern that a resin layer does not exist in both (c1) a first area around the electrode pad, and at least one of following areas (c2) to (c4): (c2) a second area around an area in which a wiring is formed, (c3) a third area around an area on which a passive element is mounted, and (c4) a fourth area around an area with which an area of the function element where device performances of the function element are influenced by resin of which the resin layer was composed, makes contact.

In still another aspect of the present invention, there is provided a coupling structure between a function element and a substrate, wherein at least one of the function element and the substrate includes an electrode pad formed on a surface thereof, the electrode pad is electrically coupled to the function element or the substrate through a bump, a resin layer having adhesive property and sealing property is sandwiched between the function element and the substrate, and the resin layer is patterned in such a pattern that a resin layer does not exist in (a) a first area around a wiring formed on the substrate, (b) a second area around a passive element mounted between the function element and the substrate, (c) a third area around, (d) a fourth area around the electrode pad, and (e) an area around the bump.

In yet another aspect of the present invention, there is provided a method of forming the coupling structure as mentioned above, including the step of coupling a function element and a substrate to each other through a resin layer composed of resin having adhesive property and sealing property, at least one of (a) a passive element mounted on the substrate and (b) an area of the function element where device performances of the function element are influenced by resin of which the resin layer was composed, being made greater in temperature than other parts.

There is provided a method of coupling a function element as set forth earlier to a substrate, including the step of thermally compressing resin having adhesive property and sealing property and electrodes formed on at least one of the function element and the substrate, to bond them with each other.

There is further provided a method of coupling a function element to a substrate, including the step of coupling a function element as set forth in claim 1 to a substrate with a resin layer being sandwiched therebetween, the resin layer being composed of resin having adhesive property and sealing property, at least one of (a) a passive element mounted on the substrate and (b) an area of the function element where device performances of the function element are influenced by resin of which the resin layer was composed, being made greater in temperature than other parts.

There is still further provided a method of coupling a substrate as set forth earlier to a function element, including the step of thermally compressing resin having adhesive property and sealing property and electrodes formed on at least one of the function element and the substrate, to bond them with each other.

There is yet further provided a method of coupling a substrate as set forth in claim 9 to a function element, including the step of coupling a function element as set forth in claim 1 to a substrate with a resin layer being sandwiched therebetween, the resin layer being composed of resin having adhesive property and sealing property, at least one of (a) a passive element mounted on the substrate and (b) an area of the function element where device performances of the function element are influenced by resin of which the resin layer was composed, being made greater in temperature than other parts.

There is yet further provided a method of coupling a function element to a substrate, including the step of coupling a function element to a substrate with a resin layer being sandwiched therebetween, the resin layer being composed of resin having adhesive property and sealing property, the step including a first step of applying ultrasonic wave to the resin layer with a bump making contact with an electrode pad, the bump being formed on one of the function element and the substrate, and the electrode pad on the other, and a second step of thermally compressing the function element and the substrate with the resin layer being sandwiched therebetween.

There is still yet further provided a method of coupling a function element to a substrate, including the step of coupling a function element to a substrate as set forth earlier, the step including a first step of applying ultrasonic wave to the resin layer with a bump making contact with an electrode pad, the bump being formed on one of the function element and the substrate, and the electrode pad on the other, and a second step of thermally compressing the resin layer onto the function element.

It is preferable that the first and second steps are simultaneously carried out.

There is still yet further provided a method of coupling a function element to a substrate, including the step of coupling a function element to a substrate as set forth earlier, the step including a first step of applying ultrasonic wave to the resin layer with a bump making contact with an electrode pad, the bump being formed on one of the function element and the substrate, and the electrode pad on the other, and a second step of thermally compressing the resin layer onto the substrate.

In the function element and the substrate on which a function element is to be mounted, in accordance with the present invention, a bump formed on a function element or on a substrate, or a portion of a wiring with which a bump makes contact is collapsed when a function element is coupled to a substrate. The resin layer does not make contact with a wiring layer formed on the substrate. Even if a passive element is higher than a surface of the substrate, the resin layer does not make contact with the passive element.

Hence, as illustrated in FIG. 7, even if the resin layer 6 would not be collapsed by a length equal to a height of the wiring layer 9 or a height of the passive element 15, the resin layer 6 makes close contact with an active surface of the function element 1 and a surface of the substrate 10. In a conventional method, when the resin layer is exposed to a light and developed, the resin layer is selectively removed in an area around pads or bumps. To the contrary, the present invention makes it possible to couple the function element 1 to the substrate 10 at a smaller pressure than the conventional method, and to prevent the resin layer 6 from containing bubbles or gaps, ensuring reliable connection with less structural defects.

Even if the sealing resin layer 6 is not collapsed, the resin layer 6 makes close contact with surfaces of the function element 1 and the substrate 10. Hence, the bumps 5 may be designed to have any height, if the resin layer 6 is designed to have a thickness equal to a sum of a thickness of the wiring layer 9 and a height of the bumps 5. As a result, it is possible to design the bumps 5 to have a smaller height than conventional bumps, which ensures reduction in costs in material of which the bumps 5 are composed of.

When the bumps 5 are formed as plated bumps, it would be possible to shorten a period of time for forming bumps.

It would be possible to couple a function element to a print circuit board on which a copper foil having a thickness of 20 $\mu$m or greater has been already formed, for instance. It is no longer necessary to prepare any particular substrate suitable for connection.

When a function element is coupled to a substrate with sealing resin having photosensitivity, thermosetting property and small fluidity, being sandwiched therebetween, it is possible to prevent resin from adhering to a surface of a wiring layer in accordance with the present invention. Hence, even if the bumps are designed to have a height smaller than a thickness of the resin layer, it would be possible to cause summits of the bumps to make contact with electrodes. Thus, even if the resin layer is exposed to a light by means of an adhesion type exposure device, it would be possible to prevent summits of the bumps from being collapsed, and it would be no longer necessary to apply a big pressure for coupling the function element to the substrate. That is, it is possible to form the resin layer containing no bubbles, and accomplish reliable connection with less structural defects at a small pressure.

In accordance with the present invention, when a function element is coupled to a substrate by thermal compression with a patterned resin layer having photosensitivity and thermosetting property, being sandwiched therebetween, it is possible to prevent extra resin which is generated in thermal compression, from adhering to a passive element, or to a portion of the function element harmfully influenced by the resin.

In accordance with the present invention, the bumps 5 are connected to the wiring layer 9 at a low pressure and at a low temperature such as room temperature with ultrasonic waves being applied thereto. In addition, if the resin layer is designed to be made of resin having tacking property at room temperature and low elasticity, it is possible to couple insulating portions between the function element and the substrate in thermal compression with the resin layer being sandwiched therebetween, at a low temperature in a low stress and in a short period of time. Specifically, it takes about 1 second to couple electrical portions to each other, and it takes about 1 second to couple insulating portions to each other. That is, it is possible to carry out coupling the function element to the substrate only by about two seconds.

In the conventional method of coupling a function element to a substrate with sealing resin having photosensitivity and thermosetting property being sandwiched therebetween, as suggested in Japanese Patent No. 2503735, Japanese Patent No. 2661382, Japanese Unexamined Patent Publication No. 5-36761, Japanese Unexamined Patent Publication No. 6-21149, Japanese Patent No. 2660943, and Japanese Patent No. 2655496, as illustrated in FIG. 4B, insulating portions are coupled to each other through the resin layer, and at the same time, electrically conductive portions are coupled to each other through the bumps, between the function element and the substrate. The present invention makes it possible to shorten a period of time for coupling a function element to a substrate, relative to a period of time for carrying out thermal compression by using bumps which cannot be molten for connection.

In the method in accordance with the present invention, connection between electrical conductors through the bumps and connection between insulating portions through the resin are carried out by applying ultrasonic waves thereto, as illustrated in FIG. 10A, and by thermal compression, as illustrated in FIG. 10B, respectively. Hence, even when the connection between insulating portions through the resin and the connection between electrical portions through the bumps are simultaneously carried out, it is no longer necessary to simultaneously satisfy optimal conditions for those connections. It is possible to separately satisfy those optimal conditions, which ensures reliable connection.

In thermal compression to be carried out subsequently to the connection between the electrical portions through the bumps, a pressure is applied merely for causing the resin layer to make close contact with a surface of the substrate or the function element. Hence, it is no longer necessary to apply a big pressure in order to collapse both the resin and the bumps unlike a conventional method for simultaneously carrying out the connection between electrical conductors through the bumps and the connection between insulating portions through the resin. As a result, it is possible for the function element and the substrate to be less damaged.

Since the sealing resin having photosensitivity and thermosetting property, used in the present invention, is heated at a temperature equal to or lower than a curing point of the resin for about 1 second when the function element 1 is coupled to the substrate 8, as illustrated in FIG. 10B, the sealing resin is hardly cured by heat. That is, the sealing resin in thermoplastic condition, after the function element 1 has been coupled to the substrate 8 with the sealing resin being sandwiched therebetween. Hence, when a package having a defect in electrical connection is found in current test, the function element 1 can be readily peeled off from the substrate 8 in such a package. In addition, those function element 1 and substrate 8 can be used again for coupling.

Since it is possible to put a plurality of packages having been judged non-defective in current test, into a drier for curing the sealing resin in the packages, a period of time for curing the resin per a package could be shortened.

The sealing resin having photosensitivity and thermosetting property, used in the present invention, is dried prior to exposure to a light, and hence, is already in optically curing condition in a patterning step. Hence, the sealing resin is cured to a further degree by exposure to a light. This means that the sealing resin used in the present invention is not adhered to a tool head of a mounter, and that it is possible to prevent bubbles from being generated out of the sealing resin, unlike the resin having high fluidity, illustrated in FIGS. 5A and 5B.

In accordance with the present invention, since it is possible to make a pattern where there is no resin around the bumps, no resin is involved between the bumps and the substrate.

In addition, since the function element is coupled to the substrate only through the bumps and the electrodes, it would be possible to uniformly apply ultrasonic waves to the resin layer.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Hereinbelow is explained a method of fabricating a function element or a substrate, in accordance with an embodiment of the present invention, with reference to FIG. 8.

A function element used in the embodiment is comprised of a substrate compose of Si, GaAs, $LiTaO_3$, $LiNbO_3$ or crystal, and a wiring layer formed on the substrate. However, a structure of the function element is not to be limited to the above-mentioned one.

A substrate used in the embodiment may be comprised of an organic substrate such as a print substrate and a flexible substrate, a ceramics substrate such as an alumina substrate, a glass ceramics substrate, or a glass substrate. However, the substrate is not to be limited to those substrates.

Figure 8:
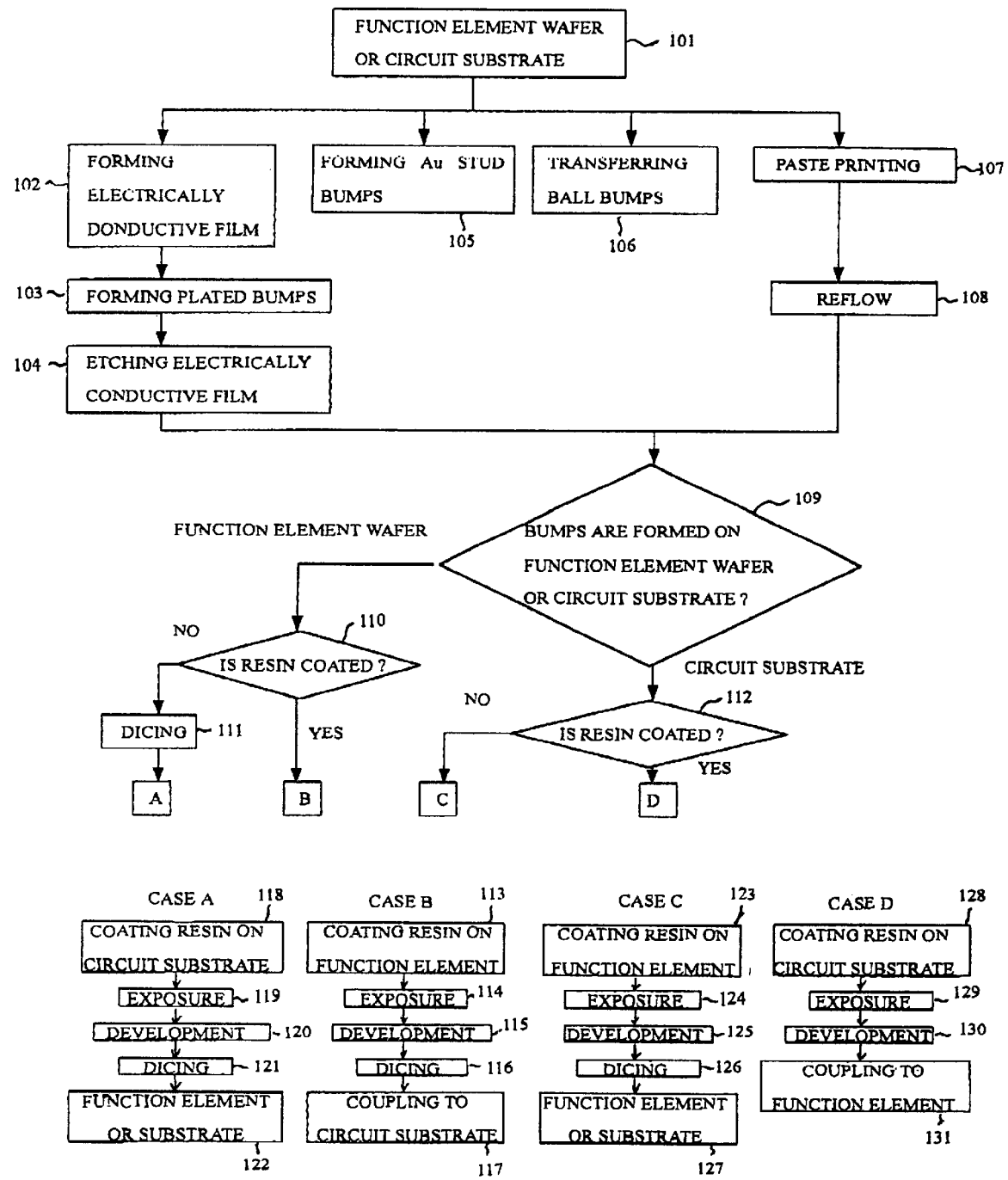
FIG. 8 is a flow chart of a method of fabricating a function element and a substrate on which a function element is to be mounted, in accordance with a preferred embodiment of the present invention.

FIG. 8 is a flow chart showing steps of forming a bump, to be carried out prior to flip-chip connection by thermal compression, and steps of forming a sealing resin layer composed of resin having photosensitivity and thermosetting property.

FIG. 8 includes process flows for the following four cases:
(1) a case in which bumps and then a sealing resin layer are formed on a function element before thermal compression (case B in FIG. 8)
(2) a case in which bumps are formed on a function element, and then, a sealing resin layer is formed on a substrate (case A in FIG. 8)
(3) a case in which bumps are formed on electrode pads formed at a surface of a substrate, and then, a sealing resin layer is formed on a function element (case C in FIG. 8)
(4) a case in which bumps are formed on electrodes formed at a surface of a substrate, and then, a sealing rein layer is formed on the substrate (case D in FIG. 8)

Common steps are carried out before steps for the above-mentioned four cases are carried out.

As illustrated in FIG. 8, there is first prepared a function element wafer or a circuit substrate in step 101. Then, bumps are formed on the thus prepared function element wafer or the circuit substrate by one of the following methods in dependence on heat-resistance of the function element wafer or the circuit substrate, a pitch between pads, and/or a size of pads. The bumps are composed of pure metal or alloy.

In accordance with the first method, an electrically conductive thin film is formed on the function element wafer or the circuit substrate in step 102, and then, plated bumps are formed in step 103. Thereafter, the electrically conductive thin film is etched for removal in step 104.

In accordance with the second method, stud bumps are formed on the function element wafer or the circuit substrate in step 105.

In accordance with the third method, ball bumps are transferred onto the function element wafer or the circuit substrate in step 106.

In accordance with the fourth method, a paste print is applied onto the function element wafer or the circuit substrate in step 107, and then, the paste print is re-flown in step 108. Thus, there are formed bumps.

Different steps are carried out in dependence on that the bumps are formed on the function element wafer or the circuit substrate (step 109).

When the bumps are formed on the function element wafer, it is determined as to whether resin is coated onto the function element wafer, in step 110. When resin is not coated (NO in step 110), the function element wafer is diced in step 111, and then, steps for carrying out the case A start. When resin is coated (YES in step 110), steps for carrying out the case B start.

When the bumps are formed on the circuit substrate, it is determined as to whether resin is coated onto the circuit substrate, in step 112. When resin is not coated (NO in step 112), steps for carrying out the case C start. When resin is coated (YES in step 112), steps for carrying out the case D start.

Hereinbelow is explained the case B in which bumps and then a sealing resin layer are formed on a function element before thermal compression.

As mentioned earlier, bumps are formed on electrode pads of the function element shaped in a wafer. In an example explained hereinbelow, plated bumps are formed on electrode pads.

Figure 9A:
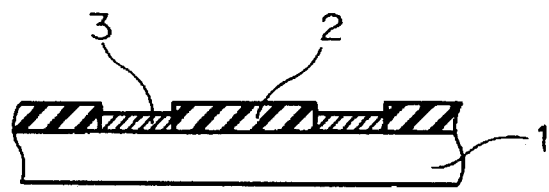
FIGS. 9A to 9E are cross-sectional views of a function element, illustrating respective step of a method of forming bumps and a sealing resin layer on a function element.

In initial condition, as illustrated in FIG. 9A, a passivation film 2 and electrode pads 3 are formed on an active surface of a function element 1.

Figure 9B:
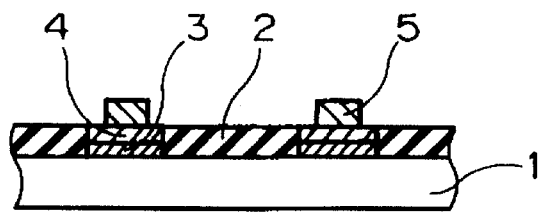

Then, as illustrated in FIG. 9B, an electrically conductive thin film 4 is formed on both the passivation film 2 and the electrode pads 3 by means of a sputtering device or an evaporation device. The electrically conductive thin film 4 may be composed of a multi-layered structure including a thin titanium layer and a thin palladium layer, a thin chromium layer and a thin palladium layer, or a thin chromium layer and a thin copper layer. The electrically conductive thin film 4 has a thickness in the range of about 0.01 μm to about 0.1 μm.

Then, a plated resist film having a thickness in the range of about 1 μm to about 100 μm is coated entirely over the electrically conductive thin film 4 by means of a roll coater, a curtain flow coater, screen printing, or a spin coater. Then, the resist film is patterned by exposure to a light and development in such a pattern that resin is removed around the electrode pads 3.

Then, bumps 5 are formed by electrolytic plating with the patterned resist film being used as a mask.

When Au-plated bumps are to be formed as the bumps 5, electrolytic plating is carried out in an order of Ni-plating, Au strike plating, and Au-plating. However, a method of forming Au bumps is not to be limited to this method. It is possible to form Cu bumps or Ag bumps by electrolytic plating.

Figure 4A:
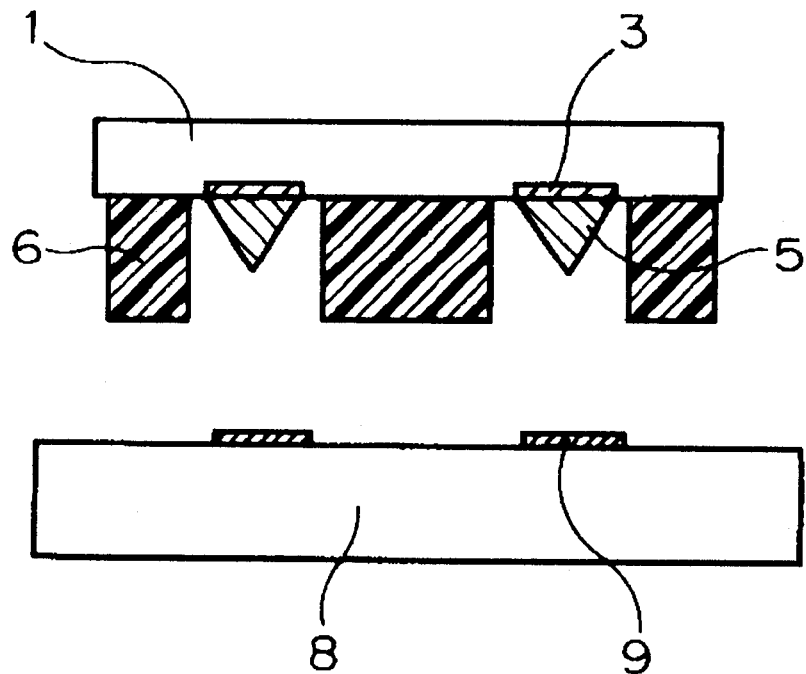
FIG. 4A is a cross-sectional view of a conventional function element and a conventional substrate before being coupled to each other.
Figure 4B:
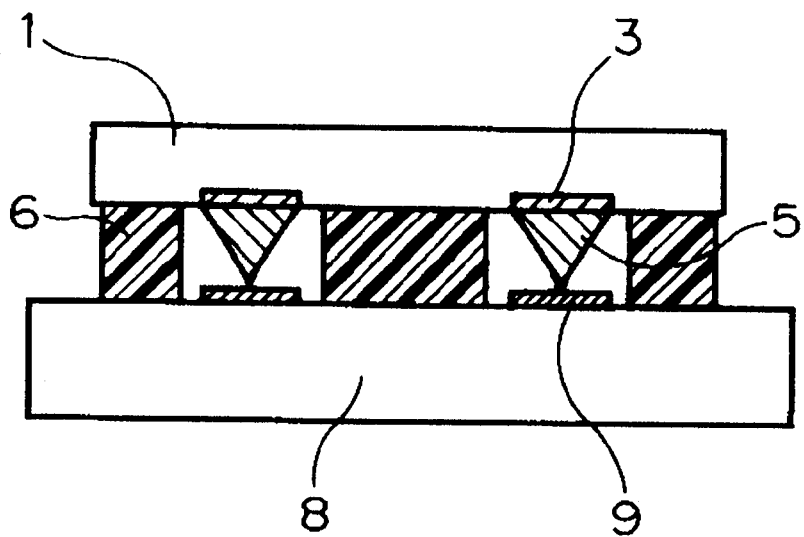
FIG. 4B is a cross-sectional view of the function element and substrate, both illustrated in FIG. 4A, after having been coupled to each other.

After the formation of the bumps 5, the resist film is removed by wet etching using a solution such as MEK or alcohol. The electrically conductive thin film 4 having been coated for carrying out electrolytic plating is selectively removed by wet etching or dry etching in an area except the bumps 5 and the electrode pads 3. Thus, there is formed such a product as illustrated in FIG. 4B.

The bumps 5 may be formed as Au stud bumps, Au bumps made by ball transferring process, In bumps, Cu bumps, ball bumps composed of alloy, or solder bumps made by printing solder paste, and reflowing. However, the bumps 5 are not to be limited to those bumps.

Figure 9C:
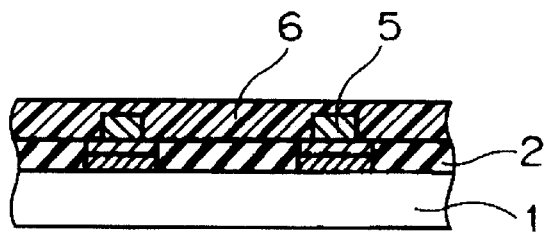

Then, as illustrated in FIG. 9C, a sealing resin layer 6 is formed entirely over the product illustrated in FIG. 9B by means of a roll coater, a curtain flow coater, screen printing, or a spin coater, in step 113 in FIG. 8. The sealing resin layer 6 is composed of resin having photosensitivity and thermosetting property, and has a thickness in the range of 1 μm to 100 μm. Then, the sealing resin layer 6 is dried.

Figure 9D:
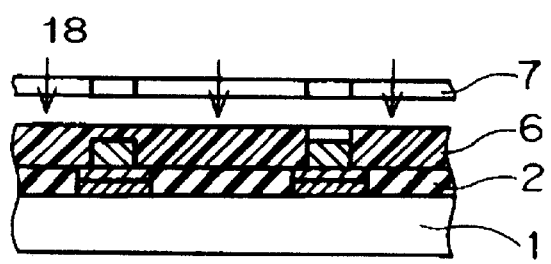

Then, as illustrated in FIG. 9D, the sealing resin layer 6 is exposed to ultraviolet (UV) rays 18 through a photomask 7, in step 114. Then, the sealing resin layer 6 is developed in step 115, and thus, is patterned into a desired pattern.

Figure 9E:
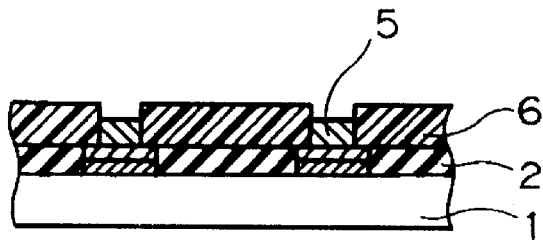

Thus, as illustrated in FIG. 9E, the sealing resin layer 6 is removed in areas just above the bumps 5.

Figure 1A:
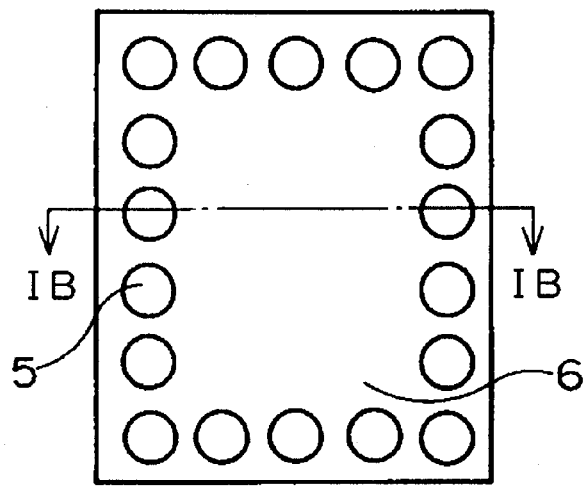
FIG. 1A is a plan view of a patterned conventional sealing resin layer.
Figure 1B:
FIG. 1B is a cross-sectional view taken along the line IB—IB in FIG. 1A.
Figure 2:
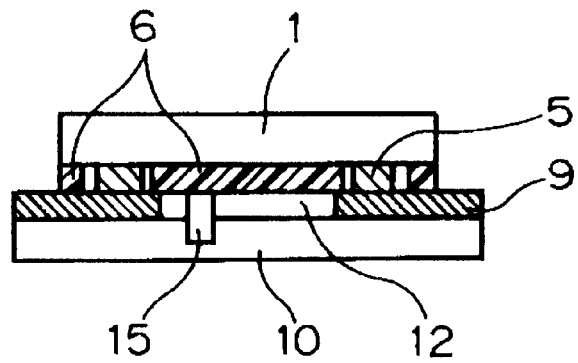
FIG. 2 is a cross-sectional view of a conventional function element and a conventional circuit board electrically connected to each other in flip-chip connection.
Figure 3A:
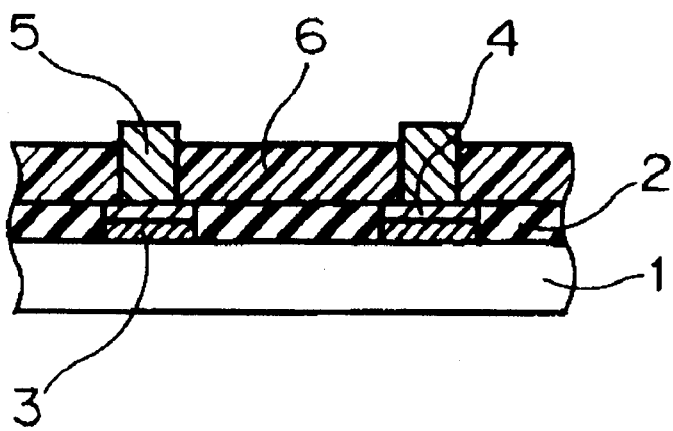
FIG. 3A is a cross-sectional view of a conventional function element.
Figure 3B:
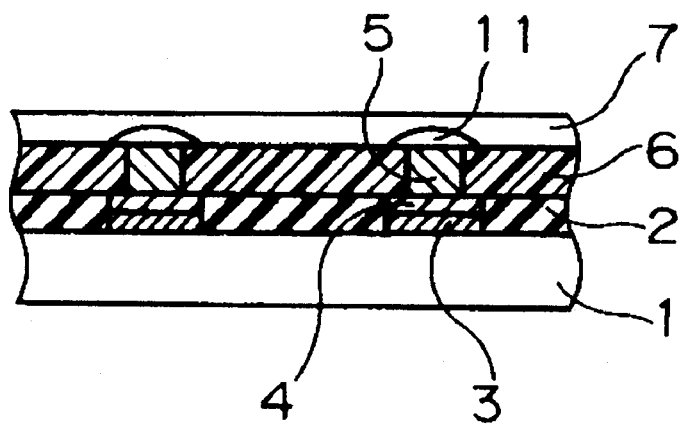
FIG. 3B is a cross-sectional view of the function element illustrated in FIG. 3A, exposed to a light by means of an adhesion type exposure device.
Figure 6A:
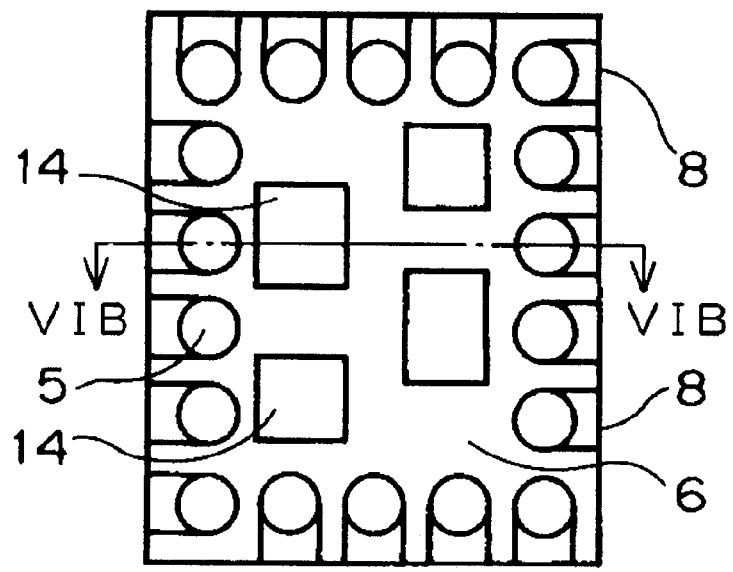
FIG. 6A is a plan view of a patterned sealing resin layer formed on a function element, in accordance with a preferred embodiment of the present invention.
Figure 6B:
FIG. 6B is a cross-sectional view taken along the line VIB—VIB in FIG. 6A.
Figure 7:
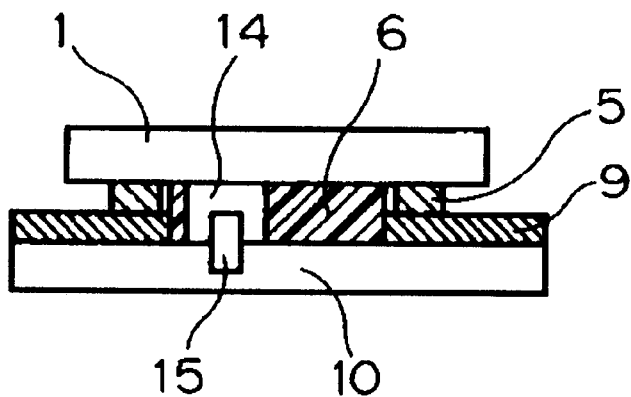
FIG. 7 is a cross-sectional view of a function element and a circuit board electrically connected to each other in flip-chip connection, in accordance with a preferred embodiment of the present invention.

In the conventional method suggested in the above-mentioned prior art such as Japanese Patent No. 2503735, the resin layer 6 is removed in areas only around the pads or bumps, as illustrated in FIGS. 1A and 1B. On the other hand, in the method in accordance with the instant embodiment, as illustrated in FIGS. 6A and 6B, the sealing resin layer 6 is removed by exposure (step 114) and development (step 115) in an area around the electrode pads 3 and the bumps 5, an area 8 with which a wiring formed on a circuit substrate 10 makes contact when the function element 1 is coupled to the circuit substrate 10, and an area 14 with which passive elements 15 mounted on the circuit substrate 10 make contact.

Referring back to FIG. 8, the function element 1 is then diced in step 116 into chips. Since the thus formed function element 1 includes the bumps 5 and the sealing resin 6, the function element 1 is coupled to a circuit substrate on which bumps and a sealing resin layer are not formed, in step 117.

Figure 11:
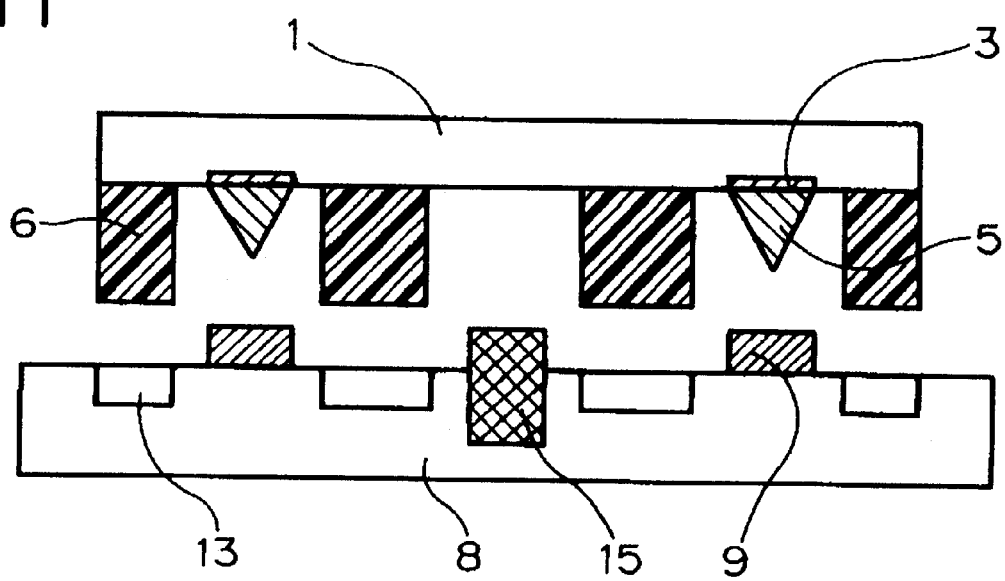
FIG. 11 is a cross-sectional view of a function element on which bumps and a patterned resin layer are formed, and a substrate, in accordance with a preferred embodiment of the present invention.

As illustrated in FIG. 11, the circuit substrate 8 may be formed at a surface thereof with recesses 13 so that the sealing resin layer 6 formed on the function element 1 is fit into the recesses 13 when the function element 1 is coupled to the circuit substrate 8. The recesses 13 prevent the resin from flowing out by pressure acting thereon, when the function element 1 is coupled to the circuit substrate 8.

The recesses 13 are designed to have a depth D defined by the following equation:

$$D = A - B - C$$

wherein A indicates a thickness of the resin layer 6, B indicates a height of the bump 5, and C indicates a height of the wiring layer 9.

As an alternative, the recesses 13 may be designed to have a depth greater than the depth D defined above. At any rate, the recesses 13 are designed to have such a depth that the resin 6 does not flow out of the function element 1 and the circuit substrate 8 when they are coupled to each other.

Hereinbelow is explained the case A in which bumps are formed on a function element, and then, a sealing resin layer is formed on a substrate.

Similarly to the case B, the bumps are formed on the function element shaped in a wafer. A circuit substrate to be coupled to the function element in flip-chip connection is cleaned at a surface thereof by means of a plasma asher in order to remove impurities out of a surface of the circuit substrate. Then, a sealing resin layer is coated onto the function element by a roll coater, a curtain flow coater, screen printing, or a spin coater, in step 118. The sealing resin layer has photosensitivity and thermosetting property, and has a thickness in the range of 1 μm to 100 μm. Then, the sealing resin layer is dried.

Then, the sealing resin layer 6 is exposed to a light through the use of the photomask 7 in step 119, and then, is developed in step 120. As a result, the sealing resin layer 6 is removed in an area 8 around the wiring layer 9 formed on the circuit substrate 10, an area 14 around an area with which the passive elements 15 mounted on the circuit substrate 10 will make contact, and an area with which the electrode pads or the bumps formed on the function element 1. If the function element 1 contains a portion which would be harmfully influenced by the resin as to device performances, the resin layer 6 is removed also in an area with which such a portion makes contact when the function element 1 is coupled to the circuit substrate 10.

Then, the function element 1 is diced in step 121. Thus, there are formed the function element and the substrate on which the function element is to be mounted, in step 122.

Dicing of a function element is carried out in only one of the steps 111 and 121.

Figure 12:
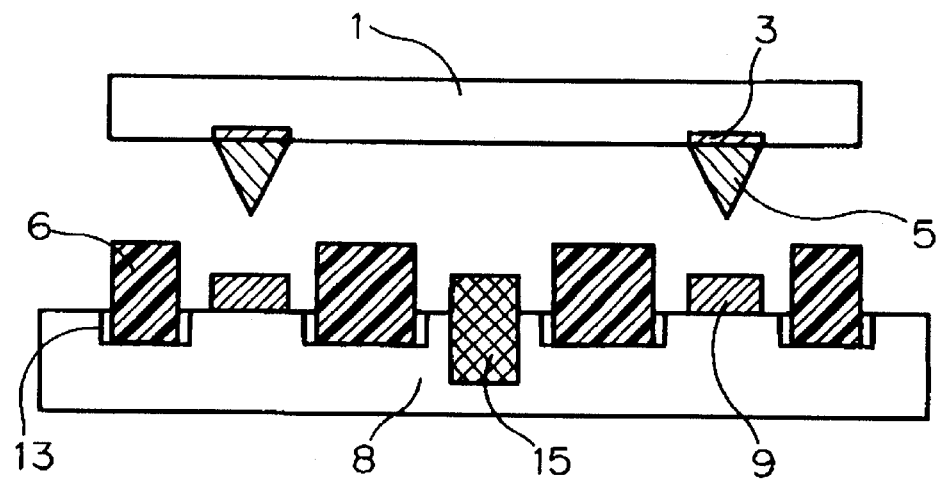
FIG. 12 is a cross-sectional view of a function element on which bumps are formed, and a substrate on which a patterned resin layer is formed, in accordance with a preferred embodiment of the present invention.

Similarly to the case B, as illustrated in FIG. 12, the circuit substrate 8 may be formed at a surface thereof with recesses 13 so that the sealing resin layer 6 formed on the function element 1 is fit into the recesses 13 when the function element 1 is coupled to the circuit substrate 8. The recesses 13 prevents the resin from flowing out of the function element 1 is coupled to the circuit substrate 8 by a pressure acting thereon, when they are coupled to each other. The recesses 13 are designed to have such a depth that the resin 6 does not flow out of the function element 1 and the circuit substrate 8 when they are coupled to each other.

Hereinbelow is explained the case C in which bumps are formed on electrode pads formed at a surface of a substrate, and then, a sealing resin layer is formed on a function element.

First, an electrically conductive thin film 4 is formed on a surface of the circuit substrate by means of a sputtering device or an evaporation device. The electrically conductive thin film 4 may be composed of a multi-layered structure including a thin titanium layer and a thin palladium layer, a thin chromium layer and a thin palladium layer, or a thin chromium layer and a thin copper layer. The electrically conductive thin film 4 has a thickness in the range of about 0.01 µm to about 0.1 µm.

Then, a plated resist film having a thickness in the range of about 1 µm to about 100 µm is coated entirely over the electrically conductive thin film 4 by means of a roll coater, a curtain flow coater, screen printing, or a spin coater. Then, the resist film is patterned by exposure to a light and development in such a pattern that resin is removed around the electrode pads 3. Then, the bumps are formed by electrolytic plating.

Then, the plated bumps are formed in the same manner as the cases A and B. A sealing resin layer is formed on a function element in the same manner as the case B. That is, a sealing resin layer 6 is formed entirely over the function element shaped in a wafer, by means of a roll coater, a curtain flow coater, screen printing, or a spin coater, in step 123 in FIG. 8. The sealing resin layer 6 is composed of resin having photosensitivity and thermosetting property, and has a thickness in the range of 1 µm to 100 µm. Then, the sealing resin layer 6 is dried.

Then, the sealing resin layer 6 is removed by exposure to a light (step 124) and development (step 125) in an area around the electrode pads and the bumps, an area with which a wiring formed on a circuit substrate makes contact when the function element is coupled to the circuit substrate, an area with which passive elements mounted on the circuit substrate make contact, and an area around a portion harmfully influenced by the resin of which the resin layer is composed of.

The function element is then diced in step 126. Thus, there are fabricated the function element and the substrate on which the function element is to be mounted, in step 127.

Figure 13:
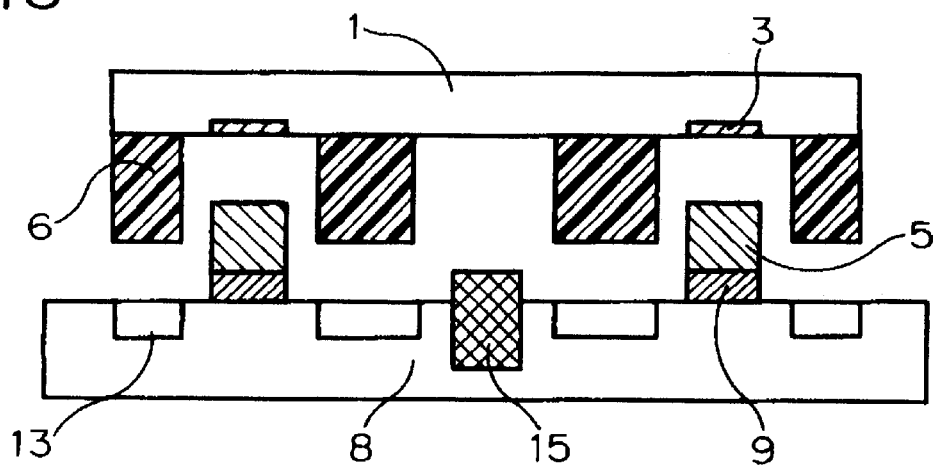
FIG. 13 is a cross-sectional view of a function element on which a patterned resin layer is formed, and a substrate on which bumps are formed, in accordance with a preferred embodiment of the present invention.

Similarly to the case B, as illustrated in FIG. 13, the circuit substrate 8 may be formed at a surface thereof with recesses 13 so that the sealing resin layer 6 formed on the function element 1 is fit into the recesses 13 when the function element 1 is coupled to the circuit substrate 8. The recesses 13 prevents the resin from flowing out of the function element 1 is coupled to the circuit substrate 8 by a pressure acting thereon, when they are coupled to each other. The recesses 13 are designed to have such a depth that the resin 6 does not flow out of the function element 1 and the circuit substrate 8 when they are coupled to each other.

Hereinbelow is explained the case D in which bumps are formed on electrodes formed at a surface of a substrate, and then, a sealing rein layer is formed on the substrate.

First, similarly to the case C, bumps are formed on a circuit substrate. Then, a sealing resin layer 6 is formed entirely over the circuit substrate by means of a roll coater, a curtain flow coater, screen printing, or a spin coater, in step 128. The sealing resin layer 6 is composed of resin having photosensitivity and thermosetting property, and has a thickness in the range of 1 µm to 100 µm. Then, the sealing resin layer 6 is dried.

Then, the sealing resin layer is exposed to a light (step 129) through the use of a photomask, and is developed (step 130). As a result, the sealing resin layer is removed in an area around a wiring layer formed on the circuit substrate, an area around passive elements mounted on the circuit substrate, an area around an area with which electrode pads or bumps formed on a function element makes contact when the function element is coupled to the circuit substrate, and an area around an area with which a portion of the function element harmfully influenced by the resin of which the resin layer is composed of, makes contact.

Thus, there is formed the circuit substrate on which the function element is to be mounted. Since the substrate includes the bumps and the sealing resin layer formed thereon, the substrate is coupled to a function element on which bumps and a sealing resin layer are not formed, in step 131.

Figure 14:
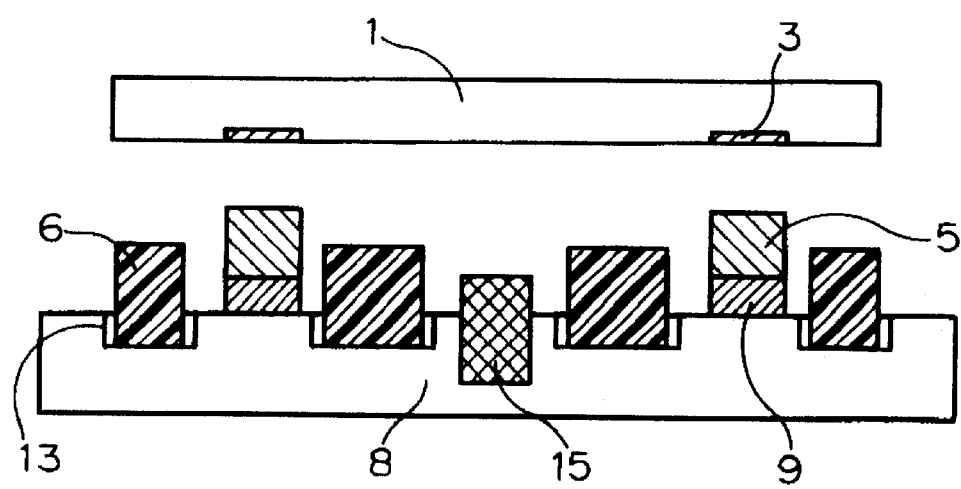
FIG. 14 is a cross-sectional view of a function element, and a substrate on which bumps and a patterned resin layer are formed, in accordance with a preferred embodiment of the present invention.

As illustrated in FIG. 14, the circuit substrate 8 may be formed at a surface thereof with recesses 13. The sealing resin layer 6 is formed in the recesses 13. The recesses 13 prevents the resin from flowing out of the function element 1 is coupled to the circuit substrate 8 by a pressure acting thereon, when they are coupled to each other. The recesses 13 are designed to have such a depth that the resin 6 does not flow out of the function element 1 and the circuit substrate 8 when they are coupled to each other.

As mentioned above, the function element or the substrate is fabricated in accordance with one of the following methods: a method in which bumps and then a sealing resin layer are formed on a function element before thermal compression (case B in FIG. 8); a method in which bumps are formed on a function element, and then, a sealing resin layer is formed on a substrate (case A in FIG. 8); a method in which bumps are formed on electrode pads formed at a surface of a substrate, and then, a sealing resin layer is formed on a function element (case C in FIG. 8); and a method in which bumps are formed on electrodes formed at a surface of a substrate, and then, a sealing rein layer is formed on the substrate (case D in FIG. 8). In the structure in which the function element is coupled to the substrate in accordance with one of the above-mentioned methods, a sealing resin layer having photosensitivity and thermosetting property is sandwiched between the function element and the substrate, and the sealing resin layer is removed in an area a wiring layer formed on the substrate, an area around passive elements such as L, C and R mounted between the function element and the substrate, an area around a portion of the function element, harmfully influenced by the resin, an area around the pads, and an area around the bumps.

As the sealing resin having photosensitivity and thermosetting property, there may be used resin commercially available from Shin-Nittetsu Kagaku in the tradename of "V-259PA", having viscosity in the range of 200 to 1000 cps, resin commercially available from Asahi Kasei Kogyo in the tradename of "Pymer", which is a polyimide precursor having negative type photosensitive groups, or resin commercially available from Sumitomo Bakelight in the tradename of "Sumiresin CRC-8300", which has positive type photosensitive groups. However, the sealing resin used in the present invention is not to be limited to those resins.

A flip-chip mounter is used for coupling the function element to the substrate. One of the function element and the substrate is vacuum-sucked to a tool, and the other is vacuum-sucked to a stage. Thereafter, the function element and the substrate are aligned to each other by means of a camera, and then, thermally compressed to each other.

A pressure for thermal compression is determined in dependence on the number of the bumps and an area of the resin layer at a temperature in the range of room temperature to about 500 degrees centigrade at which properties of the function element are destroyed. Specifically, a pressure is set greater than a minimum pressure at which electrical conduction is accomplished between the function element and the substrate, but smaller than a maximum pressure at which structural defects would be caused, and is determined to such a value that bubbles and/or gaps are not generated in the resin layer.

When the function element has a portion harmfully influenced by the resin as to performances of the function element, and the resin layer is removed in an area around such a portion, there are used a tool and a stage both including a flip-chip mounter, such as a pulse heater and a ceramic heater, which can make a program for varying a temperature with the lapse of time. Thus, the circuit substrate can be kept at a lower temperature than the function element in thermal compression and following cooling-down, and hence, it is possible to cause organic gas generated at thermal compression to be aggregated at or adhered to the circuit substrate.

As mentioned so far, electrical connection between the function element and the wiring layer through the bumps, and adhesion and sealing between the same through the resin layer are accomplished at the same time.

Figure 10A:
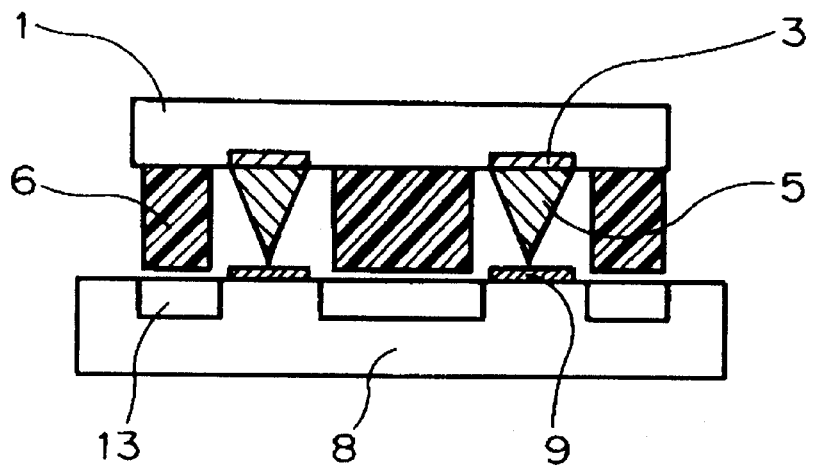
FIG. 10A is a cross-sectional view of a function element and a substrate, to which ultrasonic waves are applied with bumps being in contact with electrodes.

When the function element is to be coupled to the substrate, there may be used a flip-chip mounter having a function of applying ultra-sonic waves. In use, one of the function element 1 and the substrate 8 is vacuum-sucked onto a tool, and the other is vacuum-sucked onto a stage. Then, the function element 1 and the substrate 8 are aligned to each other, and subsequently, as illustrated in FIG. 10A, ultra-sonic waves are applied to the bumps 5 and the electrodes 9 for connection with the bumps 5 being kept to make contact with the electrodes 9.

Figure 10B:
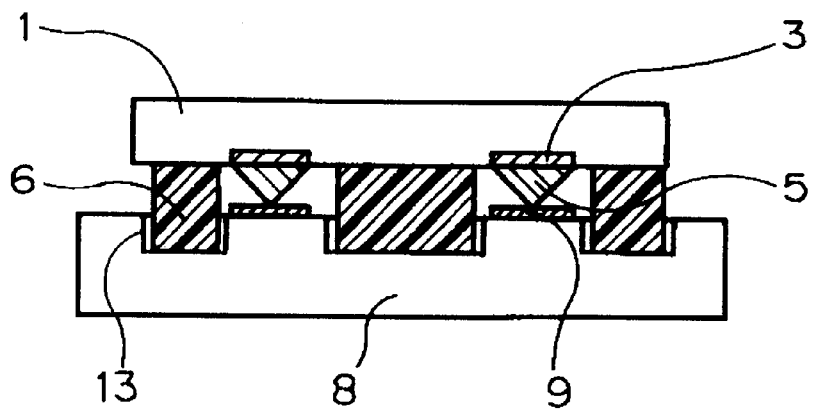
FIG. 10B is a cross-sectional view of a function element and a substrate both thermally compressed to each other.

Then, as illustrated in FIG. 10B, the function element 1 is compressed onto the substrate 8 at such a pressure that the bumps 5 are collapsed and the resin layer 6 makes contact with a surface of the circuit substrate 8. Then, the resin layer 6 is heated to thereby cause insulating portions to be connected between the function element 1 and the substrate 8.

Then, a plurality of packages constituted of the function element 1 and the substrate 8 are put into a drier to heat the resin layer 6 for curing.

Another sealing resin may be dropped onto a periphery of each of the packages through a dispenser before the packages are put into the drier. Such another sealing resin is cured in the drier together with the resin layer 6.

Hereinbelow are explained examples of the above-mentioned embodiment.

Hereinbelow is explained the case B in which bumps and then a sealing resin layer are formed on a function element before thermal compression.

First, there was prepared a silicon semiconductor device having a size of 3.5 mm ×5.3 mm. On the silicon semiconductor device were mounted 81 electrode pads at a pitch of 150 $\mu$m. Each of the electrode pads had a size of 110 $\mu$m×110 $\mu$m. On the electrode pads were formed Au-plated bumps having a size of 90 $\mu$m×90 $\mu$m.

Then, an aluminum oxide film formed on an active surface of the silicon semiconductor device was removed by reverse-sputtering by means of a sputtering device. Then, a thin titanium layer having a thickness of 0.05 $\mu$m and a thin palladium layer having a thickness of 0.15 $\mu$m were deposited on the active surface of the semiconductor device by forward-sputtering. Then, a plated resist film was coated onto the silicon semiconductor device having been taken out of the sputtering device, by a thickness of about 25 $\mu$m by means of a spin coater. Then, the plated resist film was exposed to a light and developed into such a pattern that resin was removed in areas around the electrode pads. Then, Au-plated bump were formed on the silicon semiconductor device by electrolytic plating with the thus patterned resist film being used as a mask.

The Au-plated bumps were formed by carrying out electrolytic plating in an order of Ni plating, Au strike plating, and Au plating. After the Au-plated bumps each having a height of about 20 $\mu$m, the resist film was removed by wet etching using a solvent such as MEK or alcohol.

The titanium layer and the palladium layer were removed by wet etching or dry etching such as IBE in an area except the bumps and electrode pads. Thus, there was fabricated such a product as illustrated in FIG. 9B.

Then, as illustrated in FIG. 9C, a sealing resin layer 6 having photosensitivity and thermosetting property was coated on the product illustrated in FIG. 9B by a thickness of about 22 $\mu$m by means of a spin coater. The sealing resin layer 6 was composed of resin commercially available from Shin-Nittetsu Kagaku in the tradename of "V-259PA" and having viscosity in the range of 200 cps to 1000 cps.

After the sealing resin layer 6 has been dried, as illustrated in FIG. 9D, the sealing resin layer 6 was exposed to ultra-violet rays 18 through the use of the photomask 7, and then, was developed. Thus, the resin layer 6 was patterned into a desired pattern. In the instant example, the sealing resin layer 6 was removed in an area around the pads and the bumps, and an area 8 with which a wiring layer formed on the circuit substrate made contact, as illustrated in FIGS. 6A and 6B.

Then, the function element 1 was diced. Thus, there was fabricated a to be coupled to a substrate.

The thus fabricated silicon semiconductor device was coupled to a flexible substrate by means of a coupler commercially available from Shibuya Kogyo in the tradename of "DB100". The flexible substrate had a height of about 30 $\mu$m, and included an Au-plated electrode wiring formed on a surface thereof.

Then, the silicon semiconductor device was vacuum-sucked to a tool having a pulse heater therein, and the flexible substrate was vacuum-sucked to a stage having a constant heater therein. The silicon semiconductor device was aligned with the flexible substrate by means of a camera.

The stage was kept at room temperature, and the tool was heated at 150 degrees centigrade for ten seconds, at 280 degrees centigrade for 10 seconds, and at 400 degrees centigrade at 20 seconds by means of the pulse heater. A load for thermal compression was gradually increased up to 10 kg to 40 kg, as the tool was heated incrementally.

Apart from the above-mentioned case, the function element was coupled to the circuit substrate in such a manner as mentioned hereinbelow.

The silicon semiconductor device was vacuum-sucked to a tool having a function of application of ultra-sonic waves and including a pulse heater therein, and the flexible substrate was vacuum-sucked to a stage including a constant heater therein.

Then, the silicon semiconductor device as aligned to the flexible substrate by means of a camera. The stage was kept at room temperature. The bumps and the electrodes were coupled to each other by applying ultra-sonic waves to the tool with summits of the bumps 5 and the pads 9 being kept in contact with each other. The ultra-sonic waves had a frequency of 40 kHz, and were transmitted at 3 kW for 0.6 seconds.

Then, as illustrated in FIG. 10B, a temperature was raised from room temperature, and was kept at 400 degrees centigrade for 1 second while thermal compression between the resin layer 6 and the semiconductor chip. A load for thermal compression was gradually increased up to about 5 kg as a temperature of the pulse heater was increased.

As mentioned above, electrically conductive portions were coupled to each other through the bumps, and at the same time, the silicon semiconductor device was coupled to the flexible substrate through the sealing resin.

In the conventional methods, since thermal compression was carried out by applying a load of 40 kg or greater to the silicon semiconductor device, the flexible substrate on which the silicon semiconductor device was mounted was much deformed, and accordingly, circuits fabricated on the flexible substrate were out of place. Since the silicon semiconductor device is coupled to the flexible substrate under such circumstance, it was quite difficult to ensure electrical connection between the bumps formed on the semiconductor device and the electrodes formed on the substrate.

In the flexible substrate and the silicon semiconductor device coupled to each other in accordance with the example, it was possible to couple them to each other at a low load than the conventional methods.

In addition, since the flexible substrate was deformed to a less degree than the conventional methods, defects in connection between the bumps and the electrodes, caused by circuits being out of place on the flexible substrate, could be eliminated.

In the heat cycle tests having been carried out at a temperature in the range of −40 degrees centigrade to 125 degrees centigrade, the product could pass the test over 1000 cycles.

Hereinbelow is explained the case D in which bumps are formed on electrodes formed at a surface of a substrate, and then, a sealing rein layer is formed on the substrate.

First, there was prepared a print substrate composed of FR-4. Wirings having a height of about 7 $\mu$m were formed on a surface of the print substrate at a pitch of 110 $\mu$m.

Then, a thin titanium layer and a thin palladium layer both having a thickness in the range of about 0.01 $\mu$m to about 0.1 $\mu$m were deposited on the print substrate by means of a sputtering device or an evaporation device.

Then, a plated resist film was coated on the print substrate by a thickness of about 20 $\mu$m by means of a roll coater. Then, the resist film was exposed to a light and was developed into a pattern for forming bumps. Then, electrolytic plating was carried out in an order of Ni plating, Au strike plating, and Au plating. Thus, there were formed Au-plated bumps having a height of about 7 $\mu$m. The resist film was removed by wet etching using solvent such as MEK and alcohol. The titanium and palladium layers were removed by dry etching using IBE.

Thereafter, a sealing resin layer 6 having photosensitivity and thermosetting property was coated on the print substrate by a thickness of about 14 $\mu$m by means of a spin coater. The sealing resin layer 6 was composed of resin commercially available from Shin-Nittetsu Kagaku in the tradename of "V-259PA" and having viscosity in the range of 200 cps to 1000 cps.

After the sealing resin layer 6 has been dried, the sealing resin layer 6 was exposed to ultra-violet rays 18 through the use of the photomask 7, and then, was developed. Thus, the resin layer 6 was patterned into a desired pattern. In the instant example, the sealing resin layer 6 was removed in an area around the pads and the bumps, and an area around the wirings formed on the substrate.

The thus fabricated substrate was coupled to a bare silicon semiconductor device having a size of 4 mm×13 mm by means of the coupler available from Shibuya Kogyo in the tradename of "DB100". In coupling, the silicon semiconductor device was vacuum-sucked to a tool including a pulse heater, and the substrate was vacuum-sucked to a stage including a constant heater.

The tool was heated at 150 degrees centigrade for ten seconds, and at 200–350 degrees centigrade at 20 seconds by means of the pulse heater. A load acting on the tool was gradually increased, as the tool was heated incrementally. When the load reached in the range of 5 kg to 20 kg, the substrate was coupled to the silicon semiconductor device.

In the conventional methods, the resin layer had much irregularities on a surface thereof because of the wiring layers formed on the substrate. As a result, there was generated a big gap between the resin layer and the bare silicon semiconductor device after the bare silicon semiconductor device was coupled to the substrate. Accordingly, it was difficult to accomplish electrical connection between the bumps and the electrodes, and die-share strength was small.

On the other hand, by coupling the substrate to the bare silicon semiconductor device in accordance with the example, no gaps were generated between the resin layer and the semiconductor device, and defects in electrical connection between the bumps and the electrodes could be eliminated. Thus, there was obtained sufficient electrical connection between the substrate and the bare silicon semiconductor device.

Hereinbelow is explained the case A in which bumps are formed on a function element, and then, a sealing resin layer is formed on a substrate.

First, Au stud bumps were formed on aluminum pads formed on a wafer of SAW filter. The wafer was composed of LiTaO$_3$, LiNbO$_3$ or crystal. Each of the Au stud bumps had a diameter of about 100 $\mu$m, and had a base having a height of about 25 $\mu$m. Then, the wafer was diced into function elements.

A substrate to be coupled to the thus fabricated function element in flip-chip connection is composed of FR-4, glass ceramics or alumina. The substrate was cleaned at a surface thereof by means of a plasma asher in order to remove impurities out of a surface thereof. Then, a sealing resin layer having photosensitivity and thermosetting property was coated onto the substrate by means of a spin coater by a thickness in the range of 20 μm to 50 μm. The sealing resin layer was composed of resin commercially available from Shin-Nittetsu Kagaku in the tradename of "V-259PA" and having viscosity in the range of 200 cps to 1000 cps.

Then, the resin layer was exposed to a light through the use of a photomask, and was developed to thereby pattern the resin layer into such a pattern that the resin layer did not exist in an area of a wiring layer, and an area with which IDT electrodes of SAW chip made contact. Thus, there was fabricated the substrate.

The function element was coupled to the substrate by means of the coupler commercially available from Shibuya Kogyo in the tradename of "DB200". In coupling, SAW chip was vacuum-sucked to a tool including a pulse heater therein, and the substrate was vacuum-sucked to a stage including a pulse heater therein.

If resin is adhered to IDT electrode, device performances of SAW chip is made to vary. Hence, the substrate was kept at a lower temperature than a temperature of the function element during thermal compression and cooling-down, ensuring that organic gas generated in thermal compression was aggregated or adhered onto the substrate in cooling-down.

The tool was heated at 200 degrees centigrade for five seconds, at 280 degrees centigrade for ten seconds, and at 380 degrees centigrade at twenty seconds by means of the pulse heater. At the same time, the stage was heated at 200 degrees centigrade for five seconds, at 280 degrees centigrade for ten seconds, and at 380 degrees centigrade at twenty seconds by means of the pulse heater. A load for thermal compression was gradually increased, as the tool and the stage were heated incrementally. The load was increased ultimately to 3 to 5 kg.

The connection between SAW chip and the wiring through Au bumps formed on the substrate and the sealing of surfaces of SAW chip and the substrate with the resin layer were accomplished together by coupling the function element to the substrate in the above-mentioned manner.

In accordance with the conventional methods, the resin layer was not removed in an area around the wiring, after the resin had been coated onto the substrate. Hence, the resin layer had irregularities on a surface thereof. As a result, unless a load of about 20 kg or greater was applied for thermal compression between SAW chip and the substrate, there was generated a big gap between SAW chip and the resin layer. As an alternative, when compressed, SAW chip was often broken into pieces. In addition, since a temperature of the stage to which the substrate was sucked was greater than a temperature of the tool to which SAW chip was sucked, extra resin having been generated when the stage was heated, was adhered to IDT electrodes.

On the other hand, in accordance with the instant example, no gap was generated at an interface between SAW chip and the resin layer, and the resin layer could be adhered to SAW chip at a smaller load than a load in the conventional methods.

In addition, it was possible to prevent extra resin from being adhered to IDT electrodes, ensuring filter characteristics inherent to SAW chip.

Hereinbelow is explained another example of the case A in which bumps are formed on a function element, and then, a sealing resin layer is formed on a substrate.

First, Au stud bumps were formed on aluminum pads formed on a wafer of SAW filter. The wafer was composed of LiTaO$_3$, LiNbO$_3$ or crystal. Each of the Au stud bumps had a diameter of about 100 μm, and had a base having a height of about 25 μm. Then, the wafer was diced into function elements.

A substrate to be coupled to the thus fabricated function element in flip-chip connection is composed of FR-4, glass ceramics or alumina. The substrate was formed at a surface thereof with recesses where a resin pattern was to be formed. The recesses had a depth in the range of 0.03 mm to 0.3 mm. The substrate was cleaned at a surface thereof by means of a plasma asher in order to remove impurities out of a surface thereof. Then, a sealing resin layer having photosensitivity and thermosetting property was coated onto the substrate by means of a spin coater by a thickness in the range of 20 μm to 50 μm. The sealing resin layer was composed of resin commercially available from Shin-Nittetsu Kagaku in the tradename of "V-259PA" and having viscosity in the range of 200 cps to 1000 cps.

Then, the resin layer was exposed to a light through the use of a photomask, and was developed to thereby pattern the resin layer into such a pattern that the resin layer did not exist in an area of a wiring layer, and an area with which IDT electrodes of SAW chip made contact. Thus, there was fabricated the substrate.

The function element was coupled to the substrate by means of the coupler commercially available from Shibuya Kogyo in the tradename of "DB200". In coupling, SAW chip was vacuum-sucked to a tool including a pulse heater therein and having a function of application of ultra-sonic waves, and the substrate was vacuum-sucked to a stage including a pulse heater therein.

The bumps formed on the function element were coupled to the electrode pads formed on the substrate by applying ultra-sonic waves to the tool with the bumps being kept in contact with the electrodes. The ultra-sonic waves had a frequency of 40 kHz, and were transmitted at 3 kW for 0.5 seconds.

If resin is adhered to IDT electrode, device performances of SAW chip is made to vary. Hence, the substrate was kept at a lower temperature than a temperature of the function element during thermal compression and cooling-down, ensuring that organic gas generated in thermal compression was aggregated or adhered onto the substrate in cooling-down.

The tool was heated from room temperature up to 300 degrees centigrade, and was kept at 300 degrees centigrade for one second. A load for thermal compression was gradually increased, as the tool and the stage were heated up incrementally. The load was increased ultimately to 3 to 5 kg.

The connection between SAW chip and the wiring through Au bumps formed on the substrate was accomplished in the above-mentioned manner, followed by the coupling between an active surface of SAW chip and a surface of the substrate through the resin. A plurality of the thus fabricated packages were put into a drier, and kept at 150 degrees centigrade for three hours to thereby cure the resin layer.

In accordance with the conventional methods, it took about 20 seconds or longer to connect the bumps formed on SAW chip to the pads formed on the substrate, when SAW chip was coupled to the substrate in thermal compression after application of the resin onto the substrate. In addition, since a temperature of the stage to which the substrate was sucked was greater than a temperature of the tool to which SAW chip was sucked, extra resin having been generated when the stage was heated, was adhered to IDT electrodes.

On the other hand, in accordance with the instant example, no gap was generated at an interface between SAW chip and the resin layer, and the resin layer could be adhered to SAW chip at a smaller load than a load in the conventional methods.

In addition, it was possible to prevent extra resin from being adhered to IDT electrodes, ensuring filter characteristics inherent to SAW chip.

Hereinbelow are explained other embodiments of the function element in accordance with the present invention.

In the previously mentioned embodiment, the passivation film 2 is formed on the function element 1, as illustrated in FIG. 9A. In the embodiments explained hereinbelow, the passivation films 2 are not formed.

In the instant embodiment, resin having photosensitivity and thermosetting property is coated directly on an active surface of the function element by a thickness in the range of 10 to 50 μm. The resin used was selected from resin commercially available from Asahi Kasei Kogyo in the tradename of "Pymel", which is a polyimide precursor having negative type photosensitive groups, or resin commercially available from Sumitomo Bakelight in the tradename of "Sumiresin CRC-8300", which has positive type photosensitive groups.

The resin layer was removed in an area with which a wiring formed on the substrate to be coupled to the function element in flip-chip connection, will make contact, and an area around the pads.

As a result, there was obtained the function element including the resin layer which has functions of passivation and connection.

When the function element is coupled to the substrate, it is possible to shorten a period of time for coupling them to each other by applying heat and load to them as well as by applying ultra-sonic waves to them.

Another sealing resin may be dropped onto a periphery of each of SAW chips before the packages are put into a drier. Such another sealing resin is cured in the drier together with the resin layer 6.

While the present invention has been described in connection with certain preferred embodiments, the present invention provides advantages as follows.

The first advantage is as follows. In a conventional method, when the resin layer is exposed to a light and developed, the resin layer is selectively removed in an area around pads or bumps. To the contrary, the present invention makes it possible to couple the function element to the substrate at a smaller pressure than the conventional method, and to prevent the resin layer from containing bubbles or gaps, ensuring reliable connection with less structural defects.

The reason is as follows. In the function element and the substrate on which a function element is to be mounted, in accordance with the present invention, a bump formed on a function element or on a substrate, or a portion of a wiring with which a bump makes contact is collapsed when a function element is coupled to a substrate. The resin layer does not make contact with a wiring layer formed on the substrate. Hence, even if the resin layer is not collapsed, the resin layer could make close contact with surfaces of the function element and the substrate.

The second advantage is that the bumps can be formed in a smaller amount of material than the conventional ones, because the bumps formed on the function element can be designed to have a smaller height.

The reason is as follows. Even if the sealing resin layer 6 is not collapsed, the resin layer 6 makes close contact with surfaces of the function element 1 and the substrate 10. Hence, the bumps 5 may be designed to have any height, if the resin layer 6 is designed to have a thickness equal to a sum of a thickness of the wiring layer 9 and a height of the bumps 5. As a result, it is possible to design the bumps 5 to have a smaller height than conventional bumps, which ensures reduction in costs in material of which the bumps 5 are composed of.

When the bumps 5 are formed as plated bumps, it would be possible to shorten a period of time for forming bumps.

It would be possible to couple a function element to a print circuit board on which a copper foil having a thickness of 20 μm or greater has been already formed, for instance. It is no longer necessary to prepare any particular substrate suitable for connection.

The third advantage is as follows. If the bumps are collapsed at summits thereof, a height of the bumps becomes smaller than a designed height. Hence, if the resin layer makes contact with the substrate in thermal compression, the bumps formed on the function element might not make contact with the electrodes formed on the substrate. In accordance with the present invention, the bumps does never have a height greater than a thickness of the resin layer, and hence, the bumps are not collapsed at summits thereof by a photomask when the resin layer is exposed to a light by means of an adhesion type exposure device. Hence, it is no longer necessary to apply a big pressure to the resin layer, ensuring reliable connection between the function element and the substrate.

The reason is as follows. When a function element is coupled to a substrate with sealing resin having photosensitivity, thermosetting property and small fluidity, being sandwiched therebetween, it is possible to prevent resin from adhering to a surface of a wiring layer in accordance with the present invention. Hence, even if the bumps are designed to have a height smaller than a thickness of the resin layer, it would be possible to cause summits of the bumps to make contact with electrodes. Thus, even if the resin layer is exposed to a light by means of an adhesion type exposure device, it would be possible to prevent summits of the bumps from being collapsed, and it would be no longer necessary to apply a big pressure for coupling the function element to the substrate. That is, it is possible to form the resin layer containing no bubbles, and accomplish reliable connection with less structural defects at a small pressure.

The fourth advantage is as follows. In accordance with the present invention, when a function element is coupled to a substrate by thermal compression with a patterned resin layer having photosensitivity and thermosetting property, being sandwiched therebetween, it is possible to prevent extra resin which is generated in thermal compression, from adhering to a passive element, or to a portion of the function element harmfully influenced by the resin.

The reason is as follows. In accordance with the present invention, when a portion of the function element which is harmfully influenced by the resin, the resin is removed in an area with which the portion of the function element will make contact. A temperature of the substrate is kept smaller than a temperature of the function element in thermal compression and following cooling-down, to thereby cause organic gas generated in thermal compression to aggregate on or adhere to the substrate in cooling-down. In addition, in accordance with the present invention, if a passive element harmfully influenced by the resin is mounted on the substrate, the resin is removed in an area with which the passive element will make contact with. A temperature of the substrate is kept higher than a temperature of the function element in thermal compression and following cooling-down, to thereby cause organic gas generated in thermal compression to aggregate on or adhere to the function element in cooling-down. Thus, the present invention makes it possible to prevent extra resin from adhering to a passive element or a portion of the function element harmfully influenced by the resin. As a result, the resin layer can be coupled to the electrodes at a time.

The fifth advantage is that it is possible to much shorten time necessary for coupling electrically conductive portions to each other by application of ultrasonic waves through the bumps and the electrodes, and insulating portions to each other by thermal compression through the resin layer having photosensitivity and thermosetting property.

The reason is as follows. When bumps are composed of refractory metal such as gold, metal atoms are thermally diffused and coupled to each other in the conventional methods. Hence, it is necessary to apply heat to the resin layer for 20 seconds or longer.

In accordance with the present invention, the bumps are connected to the wiring layer at a low pressure and at a low temperature such as room temperature with ultrasonic waves being applied thereto. In addition, if the resin layer is designed to be made of resin having tacking property at room temperature and low elasticity, it is possible to couple insulating portions between the function element and the substrate in thermal compression with the resin layer being sandwiched therebetween, at a low temperature in a low stress and in a short period of time. Specifically, it takes about 1 second to couple electrical portions to each other by application of ultra-sonic waves, and it takes about 1 second to couple insulating portions to each other by thermal compression. That is, it is possible to carry out coupling the function element to the substrate only by about two seconds.

The sixth advantage is that it is possible to separately determine an optimal condition for coupling the bumps to the electrode pads by application of ultra-sonic waves, and an optimal condition for coupling the function element to the substrate through the resin layer by thermal compression.

The reason is as follows. In the method in accordance with the present invention, connection between electrical conductors through the bumps and connection between insulating portions through the resin are carried out by applying ultrasonic waves thereto, as illustrated in FIG. 10A, and by thermal compression, as illustrated in FIG. 10B, respectively. Hence, even when the connection between insulating portions through the resin and the connection between electrical portions through the bumps are simultaneously carried out, it is no longer necessary to simultaneously satisfy optimal conditions for those connections. It is possible to separately satisfy those optimal conditions, which ensures reliable connection.

The seventh advantage is that the function element and the substrate can be coupled to each other at a smaller load to be applied to the bumps than the conventional methods. Hence, it is possible for the function element and the substrate to be less damaged, ensuring enhancement in reliability in connection between them.

The reason is as follows. In thermal compression to be carried out subsequently to the connection between the electrical portions through the bumps, a pressure is applied merely for causing the resin layer to make close contact with a surface of the substrate or the function element, as illustrated in FIG. 10B. Hence, it is no longer necessary to apply a big pressure in order to collapse both the resin and the bumps unlike a conventional method for simultaneously carrying out the connection between electrical conductors through the bumps and the connection between insulating portions through the resin, as illustrated in FIG. 4B. As a result, it is possible for the function element and the substrate to be less damaged.

The eighth advantage is that it is possible to extract a function element and a substrate out of a package which was judged defective as to electrical conduction in current test carried out after the function element was coupled to the substrate, and couple them to each other again.

The reason is as follows. Since the sealing resin having photosensitivity and thermosetting property, used in the present invention, is heated at a temperature equal to or lower than a curing point of the resin for about 1 second when the function element 1 is coupled to the substrate, as illustrated in FIG. 10B, the sealing resin is hardly cured by heat. That is, the sealing resin in thermoplastic condition, after the function element has been coupled to the substrate with the sealing resin being sandwiched therebetween. Hence, when a package having a defect in electrical connection is found in current test, the function element can be readily peeled off from the substrate in such a package. In addition, those function element and substrate can be used again for coupling.

Furthermore, since it is possible to put a plurality of packages having been judged non-defective in current test, into a drier for curing the sealing resin in the packages, a period of time for curing the resin per a package could be shortened.

The ninth advantage is as follows. In the present invention, there are used the substrate which is formed at a surface thereof with the recesses into which the resin layer is to be fit, as illustrated in FIGS. 11 and 13, and the substrate which is formed at a surface thereof with the recesses in which the resin layer is formed, as illustrated in FIGS. 12 and 14. Hence, when ultra-sonic waves are applied as illustrated in FIG. 10A, the resin does not flow out of the function element and the substrate, even if the bumps make contact with the electrode pads and the resin layer makes close contact with the substrate.

Similarly, the resin does not flow into an area where the electrical portions are coupled to each other between the function element and the substrate, even when pressurized in thermal compression.

The tenth advantage is that it is possible to uniformly apply ultra-sonic waves to all the bumps, because the resin does not exist around the bumps, and that it is possible to prevent the resin from being involved between the bumps and the electrodes.

Figure 5A:
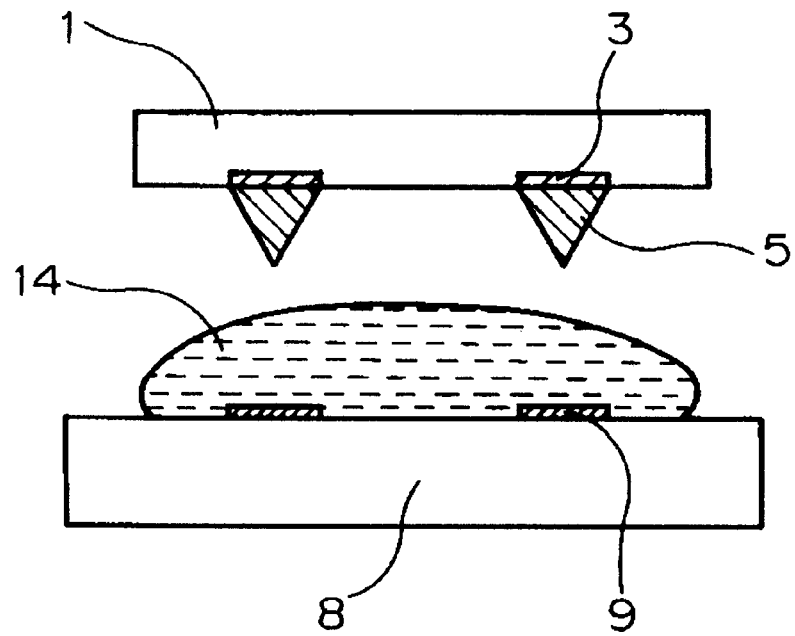
FIG. 5A is a cross-sectional view of another conventional function element and a conventional substrate before being coupled to each other.
Figure 5B:
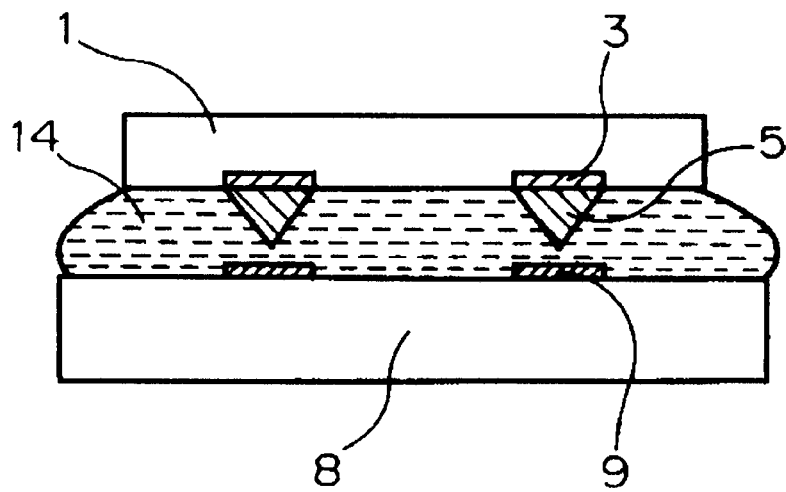
FIG. 5B is a cross-sectional view of the function element and substrate, both illustrated in FIG. 5A, after having been coupled to each other.

The reason is as follows. The sealing resin having photosensitivity and thermosetting property, used in the present invention, is dried prior to exposure to a light, and hence, is already in optically curing condition in a patterning step. Hence, the sealing resin is cured to a further degree by exposure to a light. This means that the sealing resin used in the present invention is not adhered to a tool head of a mounter, and that it is possible to prevent bubbles from being generated out of the sealing resin, unlike the resin having high fluidity, illustrated in FIGS. 5A and 5B.

In accordance with the present invention, since it is possible to make a pattern where there is no resin around the bumps, no resin is involved between the bumps and the substrate.

In addition, since the function element is coupled to the substrate only through the bumps and the electrodes, it would be possible to uniformly apply ultrasonic waves to the resin layer.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-186299 filed on Jul. 1, 1998 including specification, claims, drawings and summary is incorporated herein by reference in its entirety.

What is claimed is:

1. A function element mounting system comprising:
 a single-piece substrate having on an uppermost surface a wiring, a passive element, and a recess, the recess having equal widths at the uppermost surface and at a lowermost surface; and
 a function element including a resin layer formed on a surface thereof, the resin layer having parallel sides extending from the surface, said resin layer having adhesive property and sealing property, said resin layer having such a pattern that no resin layer exists in at least one of following areas:
  (a) a first area around an area where device performances are influenced by resin of which said resin layer was composed;
  (b) a second area around pads or bumps;
  (c) a third area around an area on which the wiring of said substrate will exist when said function element is coupled to said substrate; and
  (d) a fourth area around an area on which the passive element mounted on said substrate will exist when said function element is coupled to said substrate,
 wherein said substrate and said function element are adapted to be spaced apart in alignment for successful coupling of said substrate with said function element, and
 when in alignment, said recess has a width greater than an aligned corresponding width of a portion of the pattern of the resin layer adapted to be received by said recess.

2. The function mounting system as set forth in claim 1, wherein said function element includes at least one electrode pad, and a bump formed on said electrode pad.

3. The function mounting system as set forth in claim 1, wherein said resin layer is composed of resin having photosensitivity and thermosetting property.

4. The function mounting system as set forth in claim 1, wherein said resin layer has a function for flip-chip connection and a function of acting as a passivation film.

5. A substrate on which a function element is to be mounted and which includes a resin layer formed on a surface thereof,
 said resin layer having an adhesive property, a sealing property, and parallel sides extending from the surface,
 said substrate being formed at a surface thereof with at least one recess, said resin layer is formed in said recess, wherein said recess has a width along a bottom surface, the width being at least as great as a width of said resin layer taken parallel to said bottom surface and above an uppermost surface of said substrate.

6. The substrate as set forth in claim 5, wherein said substrate includes at least one electrode pad formed on said upper surface, and a bump formed on said electrode pad.

7. The substrate as set forth in claim 5, wherein said resin layer is composed of resin having photosensitivity and thermosetting property.

8. A combination of a function element and a substrate on which said function element is to be mounted,
 said function element including a patterned resin layer formed on a surface thereof and with parallel sides extending from the surface, said patterned resin layer having adhesive property and sealing property and a constant width, along an entire maximum height of the resin, as measured parallel to the surface,
 said substrate being formed with a recess in an area with which said resin layer makes contact, when said function element is coupled to said substrate.

9. The combination as set forth in claim 8, wherein said substrate includes at least one electrode pad, and a bump formed on said electrode pad.

10. The combination as set forth in claim 8, wherein said resin layer is composed of resin having photosensitivity and thermosetting property.

11. A coupling structure between a function element and a substrate, wherein
 at least one of said function element and said substrate includes an electrode pad formed on a surface thereof,
 said electrode pad is electrically coupled to said function element or said substrate through a bump,
 a resin layer having adhesive property and sealing property sandwiched between said function element and said substrate, and
 all of (a) a first area around a wiring formed on said substrate, (b) a second area around a passive element mounted between said function element and said substrate, (c) a third area around a wiring, and (d) a fourth area around said electrode pad, and (e) an area around said bump remain free of contact with any resin,
 said resin extending from said function element into a recess of said substrate.

12. The coupling structure as set forth in claim 11, wherein said resin layer is composed of resin having photosensitivity and thermosetting property.

13. A combination of a substrate and a function element comprising:
 a resin layer formed on a surface of a single-piece substrate, said resin layer having adhesive property and sealing property and with parallel sides extending from the surface of the substrate,
 said resin layer having such a pattern that no resin layer contacts both a first area around pads or bumps, and at least one of:
  a second area around an area in which a wiring is formed;
  a third area around an area on which a passive element is mounted; and
  a fourth area around an area with which an area of said function element where device performances of said function element are influenced by resin of which said resin layer was composed, makes contact;
 a function element,
 electrodes formed on at least one of said function element and said substrate
 wherein the resin is thermally compressed into a recess in said substrate, bonding said function element and said substrate with each other.

14. A function element mounting system comprising:
 a substrate having on a surface a wiring, a recess, and resin mounted in said recess, said resin having parallel sides extending from the substrate surface, said resin having no width greater than a width of said recess, every width being measured parallel to the substrate surface; and a function element with a pad wherein said substrate and said function element are adapted to be spaced apart in alignment of said wiring and said pad for successful coupling of said substrate and said function element.

15. The system of claim 14, further comprising a bump attached to one of said pad and said wiring, wherein said bump is intermediate said pad and said wiring when said pad and said wiring are in alignment for coupling.

16. The system of claim 14, wherein in a condition of said substrate being coupled to said function element, the width of said resin is no greater than a greatest width of said resin, every width being measured parallel to the substrate surface.

17. The system of claim 16, wherein in the coupled condition, said resin contacts said function element only in an area in alignment with said recess.

18. The system of claim 16, wherein in the coupled condition, said resin contacts only said recess, said function element, and a surrounding atmosphere.

19. The system of claim 16, wherein in the coupled condition, said recess connects with an upper surface of said substrate and said resin remains apart from said upper surface where said recess connects with said upper surface.

* * * * *